(12) United States Patent
Kitamura et al.

(10) Patent No.: US 8,645,891 B2
(45) Date of Patent: Feb. 4, 2014

(54) DEVICE FOR AND METHOD OF GENERATING WIRING DATA, AND IMAGING SYSTEM

(71) Applicant: Dainippon Screen Mfg. Co., Ltd., Kyoto (JP)

(72) Inventors: Kiyoshi Kitamura, Kyoto (JP); Kazuhiro Nakai, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 13/835,398

(22) Filed: Mar. 15, 2013

(65) Prior Publication Data

US 2014/0007033 A1  Jan. 2, 2014

(51) Int. Cl.
*G06F 17/50* (2006.01)

(52) U.S. Cl.
USPC .......................................... 716/126

(58) Field of Classification Search
USPC .......................................... 716/126
See application file for complete search history.

(56) References Cited

U.S. PATENT DOCUMENTS

| 7,394,070 | B2 * | 7/2008 | Nozoe et al. | 250/310 |
| 7,650,584 | B2 * | 1/2010 | Shiga et al. | 716/118 |
| 8,111,374 | B2 * | 2/2012 | Nakano | 355/53 |
| 2010/0213599 | A1 | 8/2010 | Watanabe et al. | 257/693 |

FOREIGN PATENT DOCUMENTS

| JP | 1-215022 | 8/1989 |
| JP | 2003-197850 | 7/2003 |
| JP | 2010-219489 | 9/2010 |
| JP | 2011-065223 | 3/2011 |
| JP | 2012-042587 | 3/2012 |

* cited by examiner

*Primary Examiner* — Suchin Parihar
(74) *Attorney, Agent, or Firm* — Ostrolenk Faber LLP

(57) ABSTRACT

It is an object to generate wiring data while controlling generation of omission of wiring and shortening process time. In order to achieve this object, a device for generating wiring data includes: an error acquiring part that acquires a configuration error of the semiconductor chip relative to a certain reference position and a certain reference angle on the substrate; an area information acquiring part that acquires enclosing area information indicating an enclosing area enclosing the semiconductor chip on the substrate; and a wiring data generating part that generates enclosing area wiring data indicating an enclosing area wiring pattern based on a reference fan-out line established for a reference chip free from a configuration error and being a part of a reference wiring pattern free from faulty wiring. The enclosing area wiring pattern is a part of the connection wiring pattern and covers the enclosing area. The wiring data generating part generates the enclosing area wiring data such that the position and the angle of the reference fan-out line relative to the reference chip, and the position and the angle of a fan-out line for the semiconductor chip on the substrate relative to this semiconductor chip, agree with each other independently of the configuration error.

10 Claims, 12 Drawing Sheets

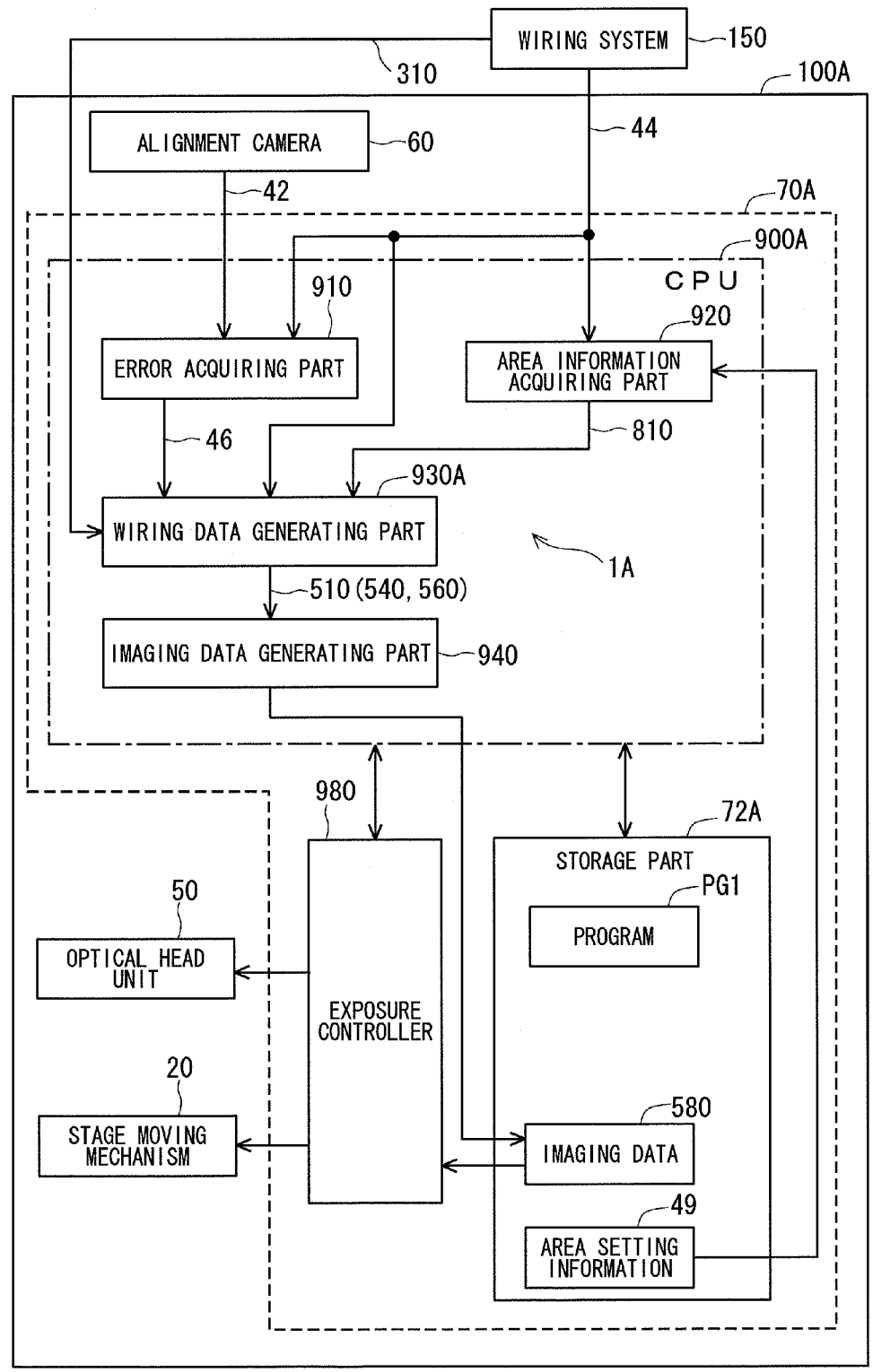
F I G . 3

F I G . 4
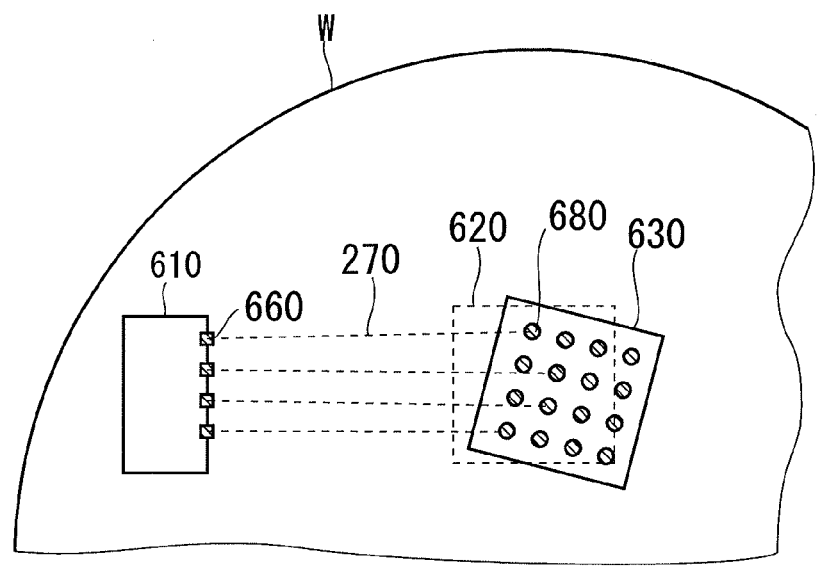
F I G . 5
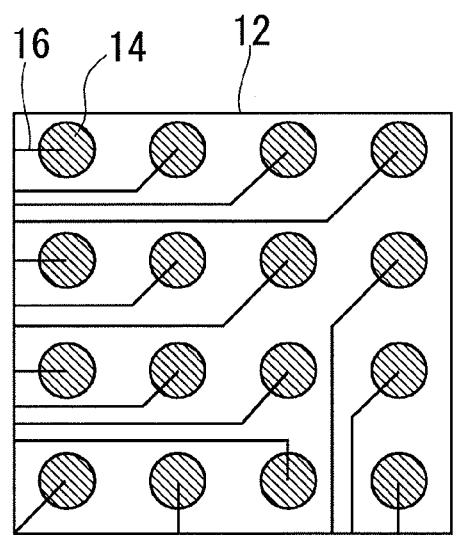

DEVICE FOR AND METHOD OF GENERATING WIRING DATA, AND IMAGING SYSTEM

BACKGROUND OF THE INVENTION

1. Field of the Invention

The present invention relates to technique of generating a wiring pattern employed in the process of manufacturing a chip-first system in package or a wafer level package, and technique of exposing the wiring pattern.

2. Description of the Background Art

In the process of manufacturing a chip-first SIP (system in package) or a WLP (wafer level package), a redistribution layer is used in connecting ICs (integrated circuits) or connecting a pad of an IC and a bump. At this time, a problem is generated about how to correct a configuration error of an IC bonded on a substrate to become a support base.

Japanese Patent Application Laid-Open No. 2003-197850 and US Publication No. 2010/0213599 disclose technique of using a stepper for exposure. According to this technique, the position and the angle of exposure through a mask are controlled finely within a range of the exposure, thereby avoiding the aforementioned problem. However, yield is reduced if there is a serious configuration error of an IC. As an example, if a distance between ICs to be connected does not fall below the length of a wiring pattern capable of being exposed through the mask, connection failure may be generated in a redistribution layer. Further, if circuit areas regarding a plurality of ICs on a substrate are to be exposed simultaneously and if configuration errors of the ICs are not the same, connection failure cannot be controlled easily.

Meanwhile, according to known technique regarding exposure, a beam for exposure is scanned without using a mask. This technique makes it possible to correct a configuration error of an IC more easily than the technique of using a mask. To be specific, if a configuration error is generated, a wiring pattern is redesigned from the beginning, and wiring data indicating the corrected wiring pattern is generated in a mask CAD format such as a GDS format. A RIP (raster image processor) performs raster image processing for an imaging system on the resultant wiring data to generate imaging data in a raster format, thereby realizing redistribution by the imaging system. However, generation of wiring data by the redesign of a pattern takes up a great deal of time. The raster image processing also takes up a great deal of time. In response, technique intended to reduce time required for generating wiring data responsive to a configuration error has been suggested in exposure by beam scanning not using a mask.

As an example, the imaging system disclosed in Japanese Patent Application Laid-Open No. 1-205022 (1989) detects the position displacement of an alignment mark assigned to each circuit area on a substrate as the position displacement of an electrode in the corresponding circuit area. Then, the system corrects a wiring pattern, to connect circuit areas when the circuit areas are placed as designed and no position displacement is generated, by horizontally shifting a part of the wiring pattern within the circuit areas in response to position displacement. At the same time, the system performs imaging by beam scanning based on the corrected wiring pattern. However, if not only position displacement but also angle displacement is generated in each circuit area, displacement of an alignment mark and displacement of an electrode being an end point of the wiring pattern do not agree with each other.

Hence, the system of Japanese Patent Application Laid-Open No. 1-205022 cannot avoid generation of connection failure in a redistribution layer.

The imaging system disclosed in Japanese Patent Application Laid-Open No. 2012-42587 compares an image formed by photographing a substrate on which each IC with a plurality of electrodes is placed and an existing wiring pattern for this substrate in the absence of a configuration error of each IC, thereby specifying a combination of electrodes in a pair being opposite end points of a line connecting ICs and the respective positions of the electrodes. Then, the system obtains linear vector data used in connecting in the shortest way the specified electrodes in a pair for each electrode pair, sets the vector data thereby obtained as a wiring pattern responsive to a configuration error of an IC, and images the wiring pattern. This allows control of connection failure to occur in a distribution layer if a configuration error of an IC includes not only position displacement but also angle change.

However, the imaging system disclosed in Japanese Patent Application Laid-Open No. 2012-42587 connects an electrode of an IC and an electrode of an IC being a destination of the connection directly through a straight line in response to configuration errors of the ICs. Hence, if electrodes of each IC are placed in a complex manner such as a BGA (ball-grid array), for example, resultant wiring patterns after correction cross each other in fan-out lines leading from the BGA, for example. This results in a problem of omission of wiring (imperfect wiring) where no wiring pattern is generated.

SUMMARY OF THE INVENTION

The present invention is intended for a device for generating wiring data indicating a connection wiring pattern extending over a substrate from each electrode of a semiconductor chip placed on the substrate.

According to the present invention, the device includes: an error acquiring part that acquires a configuration error of the semiconductor chip relative to a certain reference position and a certain reference angle on the substrate; an area information acquiring part that acquires enclosing area information indicating an enclosing area enclosing the semiconductor chip on the substrate; and a wiring data generating part that generates enclosing area wiring data indicating an enclosing area wiring pattern based on a reference fan-out line established for a reference chip. The enclosing area wiring pattern is a part of the connection wiring pattern and covers the enclosing area. The reference chip expresses the condition of the semiconductor chip placed in the reference position and the reference angle on the substrate. A reference wiring pattern free from faulty wiring is assigned to the reference chip as a pattern corresponding to the connection wiring pattern. The reference fan-out line is a part of the reference wiring pattern and routed on the reference chip. The wiring data generating part generates the enclosing area wiring data such that the position and the angle of the reference fan-out line relative to the reference chip, and the position and the angle of a fan-out line for the semiconductor chip on the substrate relative to this semiconductor chip, agree with each other independently of the configuration error.

The enclosing area wiring pattern being a part of the connection wiring pattern is generated based on the reference fan-out line being a part of the reference wiring pattern free from faulty wiring, and in response to the configuration error of the semiconductor chip relative to the reference position and the reference angle. This controls generation of omission of wiring in the enclosing area including the fan-out line and presenting a high degree of difficulty in wiring, while shortening process time required for generating wiring data. Further, the enclosing area broader than the area of the semiconductor chip makes it possible to shorten and simplify a wiring pattern except the enclosing area wiring pattern, compared to the case where the enclosing area has the same size as the semiconductor chip. This also allows the wiring pattern except the enclosing area wiring pattern to be controlled in terms of generation of omission of wiring, and to be generated in shorter time. Thus, even if electrodes of semiconductor chip are arranged in a complex manner and the semiconductor chip has a configuration error in terms of its position and its angle, wiring data indicating a connection wiring pattern can be generated while generation of omission of wiring is controlled and process time is shortened.

According to one aspect of the present invention, the device further includes a broad area wiring data acquiring part that acquires broad area wiring data indicating a broad area wiring pattern of a shape defined by the reference fan-out line leading to the outer periphery of a broad area enclosing the enclosing area. The wiring data generating part specifies in the broad area a part corresponding to the enclosing area enclosing the semiconductor chip relative to the reference chip, and specifies as the enclosing area wiring pattern a wiring pattern being a part of the broad area wiring pattern and covering the specified part, thereby generating the enclosing area wiring data.

According to a different aspect of the present invention, the broad area wiring data acquiring part acquires a plurality of broad area wiring data candidates about corresponding reference angle candidates different from each other. The wiring data generating part selects as the reference angle an angle most similar to the actual angle of the semiconductor chip on the substrate from the reference angle candidates, and selects as the broad area wiring data a broad area wiring data candidate about the reference angle from the broad area wiring data candidates.

The present invention is also intended for an imaging system that generates rasterized imaging data based on the enclosing area wiring data generated by the aforementioned device, and directly exposes a substrate placed on a stage based on the resultant imaging data.

The present invention is also intended for a method of generating wiring data indicating a connection wiring pattern extending over a substrate from each electrode of a semiconductor chip placed on the substrate.

Thus, it is an object of the present invention to provide technique that allows generation of wiring data while controlling generation of omission of wiring and shortening process time, even if electrodes of a semiconductor chip are arranged in a complex manner and the semiconductor chip has a configuration error in terms of its position and its angle.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a block diagram showing an exemplary functional structure of the imaging system of the first preferred embodiment;

FIG. 4 shows exemplary semiconductor chips placed on a substrate;

FIG. 5 shows exemplary fan-out lines;

DESCRIPTION OF THE PREFERRED EMBODIMENTS

Preferred embodiments of the present invention are described below based on the drawings. Components having similar structures and similar functions are identified by the same reference numbers, and will not be described repeatedly about the same issue. Each drawing is illustrated as a schematic drawing, so the sizes of components and the positions of the components relative to each other in each drawing are not accurately measured ones.

First Preferred Embodiment

A-1. Structure of Imaging System

Figure 1:
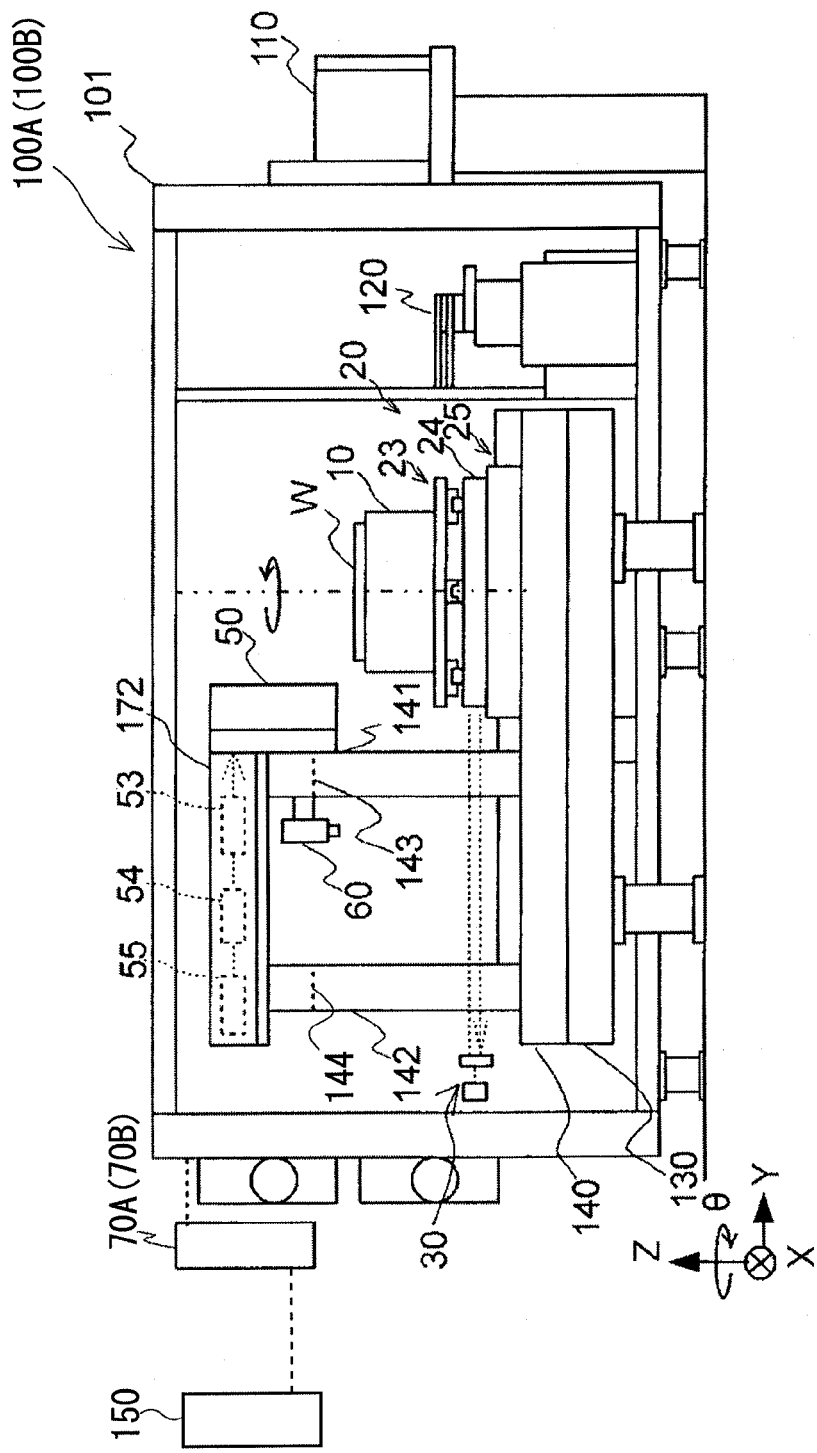
FIG. 1 is a side view showing an exemplary structure of an imaging system of each of a first preferred embodiment and a second preferred embodiment.
Figure 2:
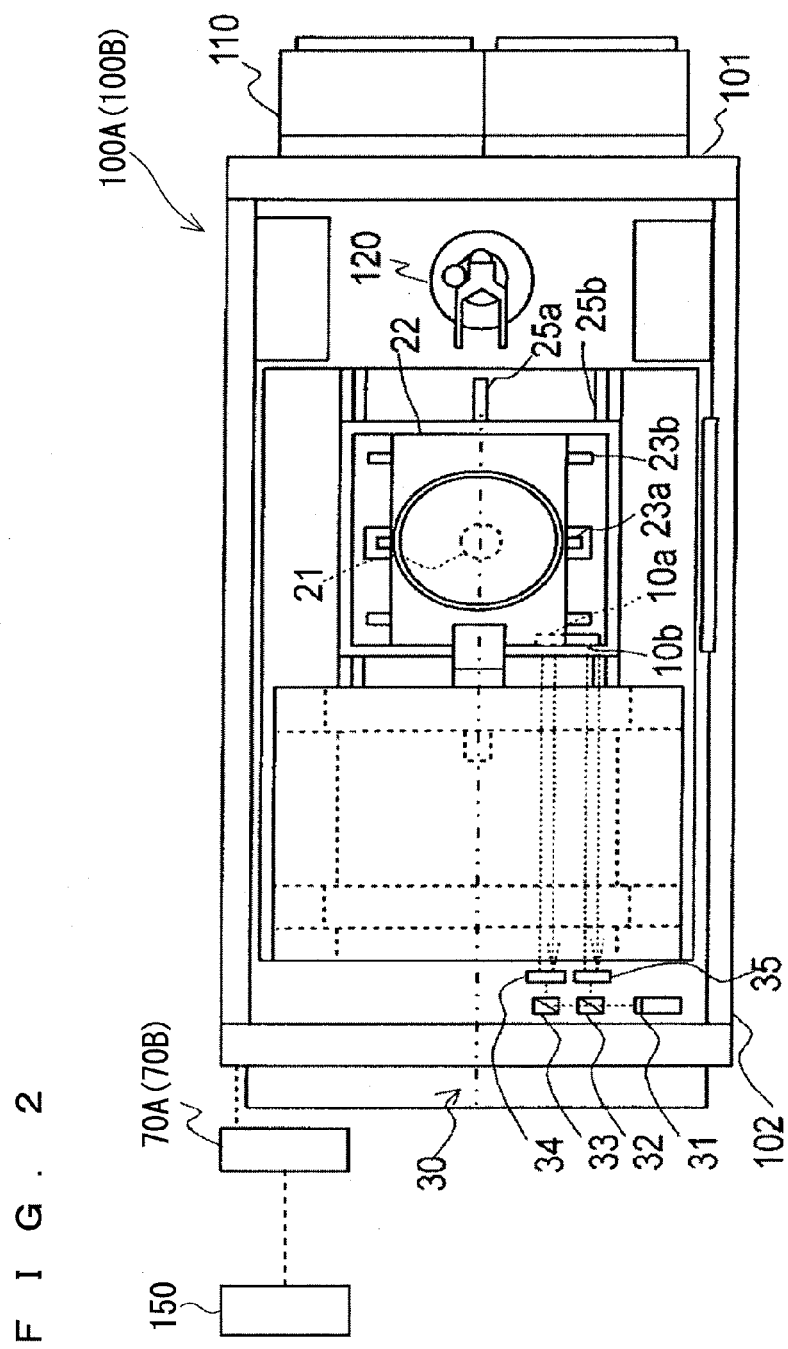
FIG. 2 is a plan view showing the exemplary structure of the imaging system of FIG. 1.

FIG. 1 is a side view showing an exemplary structure of an imaging system 100A given as an example of an imaging system of a first preferred embodiment. FIG. 2 is a plan view showing the exemplary structure of the imaging system 100A of FIG. 1. FIGS. 1 and 2 are also a side view and a plan view respectively showing an exemplary structure of an imaging system 100B given as an example of an imaging system of a second preferred embodiment described later. The imaging systems 100A and 100B structurally differ from each other in that the imaging system 100A includes a controller 70A whereas the imaging system 100B includes a controller 70B.

FIGS. 1 and 2 show a wiring system 150 as a system external to the imaging system 100A. The wiring system 150 is connected through a communication line to the controller 70A of the imaging system 100A, and is configured to be capable of transmitting and receiving data of various types to and from the controller 70A. The imaging system 100A is described first below.

The imaging system 100A is a direct imaging system that images a pattern by applying a light beam onto a surface of a substrate W such as a semiconductor substrate and a glass substrate given a photosensitive material on the surface. More specifically, the imaging system 100A is a system to image, in a step of manufacturing a multi-chip module, a wiring pattern in a resist formed on the upper surface of a support substrate (hereinafter simply called a "substrate") W as a target substrate of exposure. As shown in FIGS. 1 and 2, the imaging system 100A mainly includes a stage 10 to hold the substrate W thereon, a stage moving mechanism 20 to move the stage 10, a position parameter measuring mechanism 30 to measure a position parameter corresponding to the position of the stage 10, an optical head unit 50 to apply pulsed light onto the upper surface of the substrate W, an alignment camera 60, and the controller 70A.

The imaging system 100A has a body formed by attaching a cover 102 to a body frame 101, and components of the imaging system 100A are arranged inside the body. Further, a substrate storage cassette 110 is arranged outside the body (in the first preferred embodiment, on the right hand side of the body as shown in FIG. 1). The substrate storage cassette 110 stores unprocessed substrates W to be subjected to exposure, and these substrates W are loaded to the body by a transfer robot 120 arranged inside the body. After the unprocessed substrates W are subjected to exposure (pattern imaging), the substrates W are unloaded by the transfer robot 120 from the body to return to the substrate storage cassette 110.

As shown in FIGS. 1 and 2, the transfer robot 120 is arranged at a right edge part inside the body surrounded by the cover 102. A base 130 is arranged on the left hand side of the transfer robot 120. The base 130 has a region on one edge side (region on the right hand side of FIGS. 1 and 2) functioning as a substrate receiving and transferring region where a substrate W is transferred to and from the transfer robot 120, and a region on the opposite edge side (region on the left hand side of FIGS. 1 and 2) functioning as a pattern imaging region where a pattern is imaged on a substrate W.

A head support 140 is provided on the base 130 in the pattern imaging region. The head support 140 has two leg members 141 and two leg members 142 standing upward from the base 130. The head support 140 also has a beam member 143 and a beam member 144 provided as a bridge between the tops of the two leg members 141 and as a bridge between the tops of the two leg members 142 respectively. The alignment camera (photographing part) 60 is fixed to a part of the beam member 143 on the side of the pattern imaging region. The alignment camera 60 photographs a substrate W held on the stage 10 and having been transferred to the pattern imaging region to generate a monitor image 42 (FIG. 3). A semiconductor chip is placed on the substrate W, so that the alignment camera 60 also photographs the semiconductor chip.

FIG. 4 shows exemplary semiconductor chips placed on a surface of a substrate W. A plurality of semiconductor chips is placed on the substrate W. Each semiconductor chip is provided with a plurality of electrodes. FIG. 4 shows a part of the surface of the substrate W where semiconductor chips 610 and 630 in a pair are arranged. A semiconductor chip ("reference chip") 620 shows a condition of the semiconductor chip 630 when the semiconductor chip 630 is arranged in a certain reference position and a certain reference angle. As shown in FIG. 4, the position and the angle of the semiconductor chip 630 have configuration errors relative to the reference position and the reference angle respectively. Meanwhile, the reference chip 620 is placed in the reference position and the reference angle, meaning that the reference chip 620 does not have a configuration error. To be specific, the reference chip 620 shows the condition of the semiconductor chip 630 when the semiconductor chip 630 is placed on a substrate W in the reference position and the reference angle. A surface of the semiconductor chip 630 provided with electrodes 680 is given an alignment mark used in detecting the position and the angle of the semiconductor chip 630. With the semiconductor chips 610 and 630 placed on the upper surface of the substrate W, a resist (photosensitive material) layer is formed in advance on the upper surface of the substrate W so as to cover the semiconductor chips 610 and 630.

An alignment mark not shown in the drawings used in detecting the position and the angle of a substrate W is formed on the upper surface (also called main surface, to-be-imaged surface, or to-be-exposed surface) of the substrate W. The semiconductor chip 630 placed on the upper surface of the substrate W is given an alignment mark not shown in the drawings used in detecting the position and the angle of the semiconductor chip 630.

The semiconductor chip 610 is provided with a plurality of electrodes 660, and the semiconductor chip 630 is provided with the plurality of electrodes 680 functioning as electrodes of a BGA. In FIG. 4, connections between the electrodes of the semiconductor chip 610 and those of the semiconductor chip 630 are shown in the form of a rat's nest 270. The rat's nest 270 shows connections between electrodes specified in a net list that indicates predetermined electrical connections. The electrodes connected to each other in the rat's nest 270 are those to be electrically connected. The semiconductor chip 630 has a configuration error. Hence, if process such as exposure is performed according to reference wiring data 310 generated by the wiring system 150 based on design information about wiring of a substrate W, faulty wiring such as disconnection and omission of wiring is generated. In response, a wiring data generating device 1A of the imaging system 100A obtains a connection wiring pattern which connects electrodes the connections of which are specified in a net list in response to the actual position and the angle of a semiconductor chip, and generates wiring data indicating the connection wiring pattern. Then, the imaging system 100A performs exposure based on the resultant wiring data.

Generation of wiring data of the present invention described below is about wiring data indicating a wiring pattern which connects electrodes between the semiconductor chips 610 and 630, and which is a part of a wiring pattern which connects electrodes between all semiconductor chips on a substrate W. Wiring data indicating a different wiring pattern is generated in the same way as the wiring data indicating the wiring pattern between the semiconductor chips 610 and 630. Referring back to FIGS. 1 and 2, the stage 10 is moved by the stage moving mechanism 20 on the base 130 in X, Y and θ directions. To be specific, the stage moving mechanism 20 determines the position of the stage 10 by moving the stage 10 two-dimensionally in a horizontal plane, and by rotating the stage 10 about the axis θ (vertical axis) to adjust the angle of the stage 10 relative to the optical head unit 50. Hence, the stage 10 is caused to move relative to the optical head unit 50.

The optical head unit 50 is attached to the head support 140 of the aforementioned structure so as to be movable in the vertical direction. The alignment camera 60 and the optical head unit 50 are attached to the head support 140 in the aforementioned manner, and the positions of the alignment camera 60 and the optical head unit 50 relative to each other are fixed in the XY plane. The optical head unit 50 performs pattern imaging on a substrate W, and is moved in the vertical direction by a head moving mechanism (not shown in the drawings). In response to actuation of the head moving mechanism, the optical head unit 50 moves in the vertical direction, making it possible to adjust a distance precisely between the optical head unit 50 and a substrate W held on the stage 10. In this way, the optical head unit 50 functions as an imaging head.

A box 172 housing an optical system of the optical head unit 50 and the like is provided to bridge between the tops of the beam members 143 and 144, thereby covering the pattern imaging region of the base 130 from above.

The stage 10 is cylindrical in outer shape, and functions as a holding part to hold a substrate W placed in a horizontal angle on the upper surface thereof. A plurality of suction holes (not shown in the drawings) is formed in the upper surface of the stage 10. Thus, once a substrate W is placed on the stage 10, the substrate W is fixed under suction to the upper surface of the stage 10 by suction pressure applied through the suction holes.

The stage moving mechanism 20 is a mechanism to move the stage 10 relative to the base 130 of the imaging system 100A in a main scanning direction (Y-axis direction), in a sub-scanning direction (X-axis direction), and in a rotative direction (about the θ axis). The stage moving mechanism 20 includes a rotating mechanism 21 to rotate the stage 10, a support plate 22 to support the stage 10 so as to allow rotation of the stage 10, a sub-scanning mechanism 23 to move the support plate 22 in the sub-scanning direction, a base plate 24 to support the support plate 22 through the sub-scanning mechanism 23, and a main scanning mechanism 25 to move the base plate 24 in the main scanning direction.

The rotating mechanism 21 includes a motor composed of a rotor attached to the inside of the stage 10. A rotation bearing mechanism is provided between the lower surface of the stage 10 at a central part thereof and the support plate 22. Thus, in response to operation of the motor, the rotor moves in the θ direction, thereby rotating the stage 10 within a certain angular range about the rotation axis of the rotation beating mechanism.

The sub-scanning mechanism 23 includes a linear motor 23a that generates thrust in the sub-scanning direction with a mover attached to the lower surface of the support plate 22 and a stator placed on the upper surface of the base plate 24. The sub-scanning mechanism 23 also includes a pair of guide rails 23b along which the support plate 22 is guided in the sub-scanning direction relative to the base plate 24. Thus, in response to operation of the linear motor 23a, the support plate 22 and the stage 10 move in the sub-scanning direction along the guide rails 23b on the base plate 24.

The main scanning mechanism 25 includes a linear motor 25a that generates thrust in the main scanning direction with a mover attached to the lower surface of the base plate 24 and a stator placed on the upper surface of the head support 140. The main scanning mechanism 25 also includes a pair of guide rails 25b along which the base plate 24 is guided in the main scanning direction relative to the head support 140. Thus, in response to operation of the linear motor 25a, the base plate 24, the support plate 22, and the stage 10 move in the main scanning direction along the guide rails 25b on the base 130. A conventional X-Y-θ axis moving mechanism frequently used is applicable as the stage moving mechanism 20.

The position parameter measuring mechanism 30 is a mechanism to measure the position parameter of the stage 10 by using interference of laser light. The position parameter measuring mechanism 30 mainly includes a laser light emitting part 31, a beam splitter 32, a beam bender 33, a first interferometer 34, and a second interferometer 35.

The laser light emitting part 31 is a light source to emit laser light for measurement. The laser light emitting part 31 is arranged at a fixed position, specifically, a position fixed relative to the base 130 and the optical head unit 50 of the imaging system 100A. Laser light emitted from the laser light emitting part 31 first enters the beam splitter 32, and is split into a first split beam traveling from the beam splitter 32 toward the beam bender 33 and a second split beam traveling from the beam splitter 32 toward the second interferometer 35.

The first split beam is reflected by the beam bender 33 to enter the first interferometer 34. Then, the first split beam is applied from the first interferometer 34 to a first part 10a of an edge of the stage 10 on the −Y side (here, the first part 10a is a central part of the edge on the −Y side). The first split beam having been reflected off the first part 10a enters the first interferometer 34 again. Based on interference between the first split beam traveling toward the stage 10 and the first split beam having been reflected off the stage 10, the first interferometer 34 measures a position parameter corresponding to the position of the first part 10a of the stage 10.

The second split beam enters the second interferometer 35. Then, the second split beam is applied from the second interferometer 35 to a second part 10b of the edge of the stage 10 on the −Y side (the second part 10b is different from the first part 10a. The second split beam having been reflected off the second part 10b enters the second interferometer 35 again. Based on interference between the second split beam traveling toward the stage 10 and the second split beam having been reflected off the stage 10, the second interferometer 35 measures a position parameter corresponding to the position of the second part 10b of the stage 10. The first and second interferometers 34 and 35 transmit the position parameters obtained as a result of their measurements to the controller 70A. The controller 70A controls the position, the speed of movement of the stage 10 and the like by using the position parameters.

The optical head unit 50 is a light irradiating part to apply pulsed light for exposure onto the upper surface of a substrate W held on the stage 10. The optical head unit 50 exposes a substrate W without using a mask for exposure. More specifically, the optical head unit 50 directly exposes a substrate W placed on the stage 10 based on imaging data 58 (FIG. 3) generated by the wiring data generating device 1A. The beam member 143 is arranged above the base 130 so as to bridge over the stage 10 and the stage moving mechanism 20, and the optical head unit 50 is attached to the beam member 143. The optical head unit 50 is arranged at a substantially central part in the Y direction (main scanning direction) of the base 130. The optical head unit 50 is connected through an illumination optical system 53 to one laser oscillator 54. The laser oscillator 54 is connected to a laser driving part 55 to drive the laser oscillator 54. The laser driving part 55, the laser oscillator 54, and the illumination optical system 53 are provided inside the box 172. In response to operation of the laser driving part 55, pulsed light is emitted from the laser oscillator 54, and is then introduced into the optical head unit 50 through the illumination optical system 53.

The inside of the optical head unit 50 is mainly composed of elements (all of which are not shown in the drawings) such as a spatial light modulator to spatially modulate irradiated light, an imaging controller to control the spatial light modulator, and an optical system to apply pulsed light introduced into the optical head unit 50 onto the upper surface of a substrate W through the spatial light modulator. GLV® (Grating Light Valve®) being a diffraction grating spatial light modulator is applicable as the aforementioned spatial light modulator, for example. Pulsed light introduced into the optical head unit 50 is converted to a light beam of a predetermined pattern by the spatial light modulator, for example, and then applied onto the upper surface of the substrate W to expose a photosensitive layer such as a resist on the substrate W. As a result, the pattern is imaged on the upper surface of the substrate W.

A resist (photosensitive material) to be exposed to ultraviolet light is formed in advance on the upper surface of a substrate W so as to cover the semiconductor chips 610 and 630. The laser oscillator 54 is a third-harmonic solid laser to emit ultraviolet light of a wavelength of 355 nm. The laser oscillator 54 can certainly emit light of a different wavelength contained in a wavelength band where the photosensitive material of the substrate W is exposed to light. The imaging system 100A repeats imaging of a pattern in the main scanning direction a predetermined number of times while shifting the substrate W in the sub-scanning direction a distance corresponding to the width of exposure by the optical head unit 50, thereby forming the pattern on the entire imaging region of the substrate W.

The alignment camera ("photographing part") 60 photographs a substrate W to faun the monitor image 42 (see FIG. 3) containing images of alignment marks not shown in the drawings formed in advance at several positions on the upper surface of the substrate W and an image of an alignment mark not shown in the drawings formed on the upper surface of the semiconductor chip 630, for example. The monitor image 42 is used in detecting the position and the angle of the substrate W, and the position and the angle of the semiconductor chip 630. The alignment camera 60 can photograph even a wiring pattern for electrodes arranged in a lower layer of the resist on the substrate W. The alignment camera 60 is composed of a digital camera, for example, and is fixed through the beam member 143 to the base 130.

For photographing of the alignment marks by the alignment camera 60, the imaging system 100A first moves the stage 10 to a position closest to the −Y side (position on the left side in FIGS. 1 and 2). Then, the imaging system 100A makes an illuminating part for monitoring not shown in the drawings apply illumination light for monitoring onto a substrate W and makes the alignment camera 60 photograph the substrate W, thereby acquiring the monitor image 42 containing an image of each alignment mark. The resultant monitor image 42 is transmitted from the alignment camera 60 to the controller 70A. The controller 70A uses the monitor image 42 thereby transmitted to control the position and the angle of the substrate W relative to the optical head unit 50 and to detect a configuration error of the semiconductor chip 630 relative to the reference position and the reference angle, for example.

In response to application of illumination light from the illuminating part for monitoring onto an electrode pad composed for example of a metal film of a semiconductor chip placed on a substrate W, an infrared light component of light having been reflected off the electrode pad enters the alignment camera 60. The infrared light component makes substantially no contribution to reaction of a resist so it can pass through the resist, thereby allowing photographing of the electrode pad. If the lower layer of the resist is covered entirely by the metal film, a layer below the metal film cannot be observed. Meanwhile, it is generally unlikely that a substrate W is covered entirely by an electrode pad. Thus, it is preferable that a light source capable of emitting light containing many infrared light components be applied as a light source of the illuminating part for monitoring. It is also preferable that the alignment camera 60 be sensitive to an infrared region.

The controller 70A is an information processor to control the operation of each component inside the imaging system 100A while executing various arithmetic operations. As an example, the controller 70A is composed of a computer with a CPU 900A (FIG. 3), a storage part 72A (FIG. 3) and the like electrically connected to each other. The controller 70A also includes an exposure controller 980 (FIG. 3) electrically connected to the CPU 900A. The aforementioned computer and the exposure controller 980 are housed in one electrical rack (not shown in the drawings). The controller 70A is electrically connected to components such as the stage moving mechanism 20, the position parameter measuring mechanism 30, the optical head unit 50, and the alignment camera 60. The controller 70A makes the CPU 900A read a program PG1 stored in the storage part 72A and execute the program PG1, thereby controlling the respective operations of these components. The controller 70A is connected through a communication line to the wiring system 150 external to the imaging system 100A.

The controller 70A detects a wiring pattern and the position of an electrode in a lower layer of a resist layer on a substrate W by using the monitor image 42 generated as a result of photographing of the substrate W by the alignment camera 60, thereby allowing detection of the position of an electrode pad of a semiconductor chip. The controller 70A also compares the detected position of the electrode and a wiring pattern generated in advance for a semiconductor chip in the reference position and the reference angle, thereby allowing detection of a configuration error of a semiconductor chip. An alignment mark and an electrode can be detected based on an edge signal obtained by quadratic differentiation of a pixel value distribution of the monitor image 42, for example.

The wiring system 150 is composed of a CAD system, for example. The wiring system 150 generates a net list indicating electrical connections between electrodes of semiconductor chips placed on a substrate W. Based on the net list thereby generated, the wiring system 150 generates wiring data indicating a connection wiring pattern which electrically connects the electrodes of the semiconductor chips on the substrate W. More specifically, the wiring system 150 generates the reference wiring data 310 (FIG. 3) indicating a connection wiring pattern ("reference wiring pattern") for a reference chip free from a configuration error. The reference wiring pattern is a connection wiring pattern corresponding to the case where wiring failure such as electrical short and disconnection is not generated. To be specific, the reference wiring pattern free from faulty wiring is assigned to the reference chip as a pattern corresponding to the connection wiring pattern. The resultant reference wiring data 310 is supplied to the controller 70A of the imaging system 100A. Further, the wiring system 150 supplies the controller 70A with the net list about the substrate W and design information 44 (FIG. 3) containing for example the reference position and the reference angle of the semiconductor chip 630 on the substrate W.

A-2. Functional Structure of Imaging System

<A-2-1. Overall Functional Structure of Imaging System>

FIG. 3 is a block diagram showing an exemplary functional structure relating to control of imaging operation by the imaging system 100A of the first preferred embodiment. As shown in FIG. 3, the imaging system 100A mainly includes, as functional elements relating to control of the imaging operation, the alignment camera 60, the controller 70A, the optical head unit 50, and the stage moving mechanism 20. The imaging operation is controlled in response to the operations of these elements.

The controller 70A is composed of a computer with the CPU 900A and the storage part 72A such as a memory. The controller 70A includes the exposure controller 980 in addition to the computer. The CPU 900A in the computer performs arithmetic operation according to the program PG1, thereby realizing functions such as an error acquiring part 910, an area information acquiring part 920, a wiring data generating part 930A, and an imaging data generating part 940.

The error acquiring part 910, the area information acquiring part 920, and the wiring data generating part 930A form the wiring data generating device 1A. The wiring data generating device 1A generates connection wiring data 510 (FIG. 3) indicating a connection wiring pattern which electrically connects an electrode of a semiconductor chip on a substrate W and an electrode on the substrate W being a destination electrode of the connection, specifically a destination electrode arranged within an area of the substrate W, based on predetermined connection specified for example in a net list. In other words, the wiring data generating device 1A generates wiring data indicating a connection wiring pattern extending over the substrate W from each electrode of a semiconductor chip on the substrate W.

The imaging data generating part 940 generates imaging data 580 (FIG. 3) rasterized for the imaging system 100A based on the connection wiring data 510 generated by the wiring data generating device 1A.

The storage part 72A is composed of a memory such as a ROM and a RAM. The program PG1 to be read and executed by the CPU 900A, area setting information 49 and the like are stored in advance in the storage part 72A. As an example, the area setting information 49 is information about the size of an enclosing area described later. The storage part 72A also stores the imaging data 580 generated by the imaging data generating part 940, and functions as a working memory for the CPU 900A.

The exposure controller 980 controls each of the optical head unit 50 and the stage moving mechanism 20 based on the imaging data 580 stored in the storage part 72A, thereby imaging one stripe of a pattern. After one stripe is recorded by exposure, the exposure controller 980 performs the same process on a next divided area to repeat imaging strip by strip. As a result, a wiring pattern corresponding to the imaging data 580 is imaged on a substrate W.

<A-2-2. Functional Structure of Wiring Data Generating Device>

The wiring data generating device 1A is composed of the error acquiring part 910, the area information acquiring part 920, and the wiring data generating part 930A.

The error acquiring part 910 acquires a configuration error 46 (FIG. 3) of the semiconductor chip 630 relative to the reference position and the reference angle on a substrate W. More specifically, the error acquiring part 910 detects the actual position and the actual angle of the semiconductor chip 630 on the substrate W based on the monitor image 42, and compares the detected position and the angle with the reference position and the reference angle contained in the design information 44, thereby acquiring the configuration error 46. The configuration error 46 is supplied to the wiring data generating part 930A.

The area information acquiring part 920 acquires enclosing area information 810 indicating an enclosing area 710 (see FIGS. 6 and 8, for example) enclosing the semiconductor chip 630 on the upper surface of a substrate W and broader than the area of the semiconductor chip 630. As an example, the area information acquiring part 920 defines as the center of the enclosing area 710 the reference position of the semiconductor chip 630 relative to a substrate W contained in the design information 44, and then specifies the enclosing area 710 having the size, the shape and the like defined by the area setting information 49. Then, the area information acquiring part 920 acquires the enclosing area information 810 indicating the position, the size, the shape and the like of the specified enclosing area 710, and supplies the enclosing area information 810 to the wiring data generating part 930A.

It is preferable that the area setting information 49 be information capable of setting as the size of the enclosing area 710 the maximum possible range the semiconductor chip 630 moves on a substrate W. The area setting information 49 can be acquired based on a positioning error of a bonder to arrange the semiconductor chip 630 on the upper surface of a substrate W, for example. Regardless of if the determined size of the enclosing area 710 is smaller or greater than the maximum possible range, the semiconductor chip 630 can be included in the enclosing area 710 if the enclosing area 710 is broader than the area of the semiconductor chip 630. Thus, the utility of the present invention is not damaged in this case. The utility of the present invention is not damaged even if the center of the enclosing area 710 is shifted from the reference position.

The area setting information 49 may be the predetermined enclosing area information 810 itself. In this case, the area information acquiring part 920 may retrieve the enclosing area information 810 from the storage part 72A, and supply the retrieved enclosing area information 810 as it is to the wiring data generating part 930A.

Figure 8:
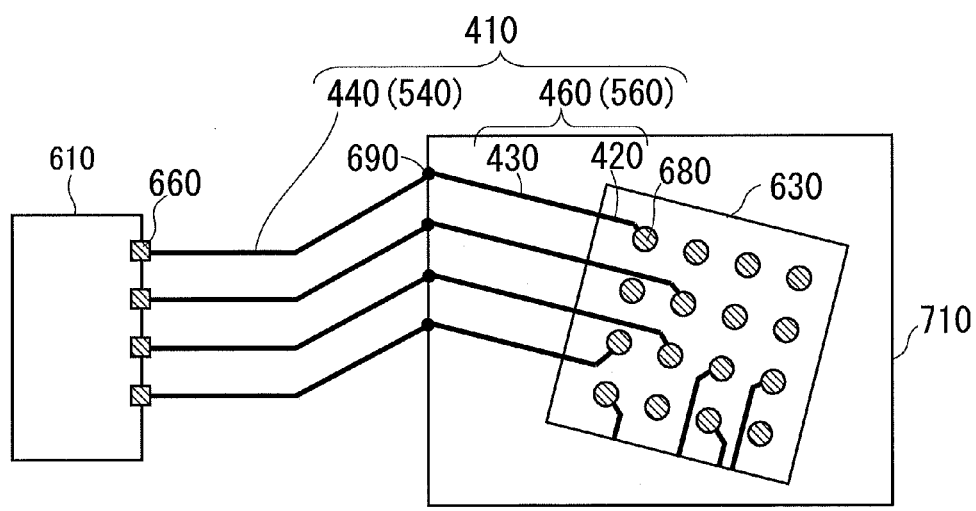
FIG. 8 shows an exemplary connection wiring pattern.

As shown in FIG. 8, based on the configuration error 46, the enclosing area information 810, the net list contained in the design information 44 and the like, the wiring data generating part 930A generates enclosing area wiring data 560 (FIG. 3) indicating an enclosing area wiring pattern 460 covering a part corresponding to the enclosing area 710.

FIG. 5 shows fan-out lines 16 as examples of fan-out lines leading from all electrodes 14 forming a BGA of a semiconductor chip 12. The fan-out lines 16 form a wiring pattern which extends from all the electrodes 14 to the outer periphery of the semiconductor chip 12, and which is a part of a connection wiring pattern leading from all the electrodes 14 to corresponding destination electrodes not shown in FIG. 5 to be connected to the electrodes 14. The connection wiring pattern is designed for example by a CAD system so as to avoid crossing or disconnection of the lines. Thus, the connection wiring pattern is changed in response to the positions and the angles of the destination electrodes and the position and the angle of the semiconductor chip 12 relative to each other. Hence, the wiring pattern of the fan-out lines is also changed in response to these relative positions and the relative angles.

In the present specification, fan-out lines for a reference chip placed in a certain reference position and a certain reference angle on a substrate W are also called "reference fan-out lines." To be specific, the reference fan-out lines are a part of the reference wiring pattern and routed on the reference chip. The reference position and the reference angle do not necessarily agree with the position and the angle of the semiconductor chip 630 as designed, but they may have various known values. Hence, the reference fan-out lines are also changed in response to the position and the angle of each electrode being a target electrode of connection and those of the semiconductor chip 12 relative to each other, specifically, in response to the reference position and the reference angle.

Figure 6:
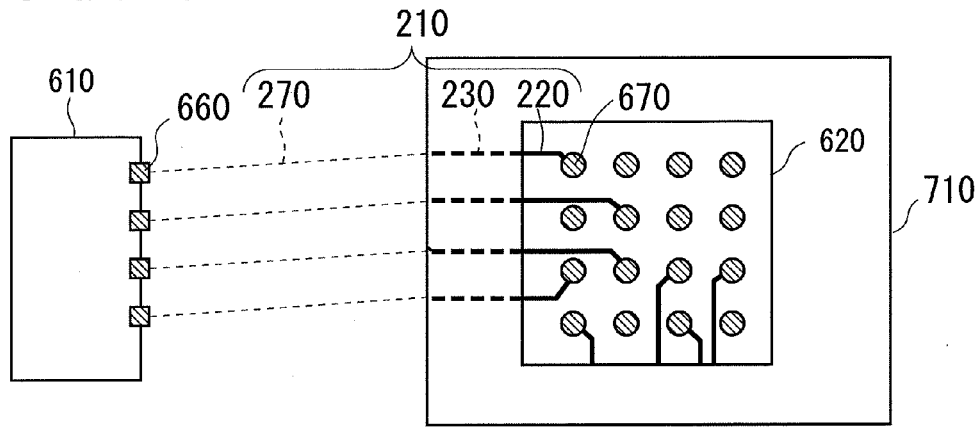
FIGS. 6 and 7 each show an exemplary reference wiring pattern.
Figure 7:
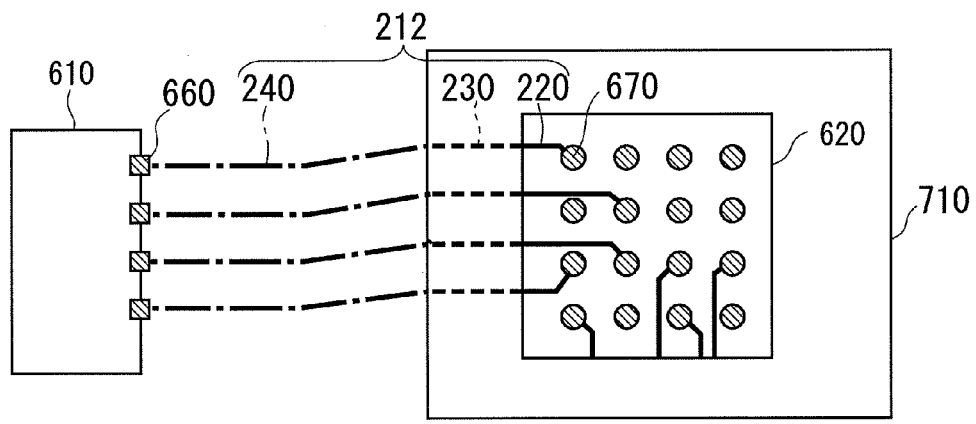

FIG. 6 shows a reference wiring pattern 210 established for the reference chip 620 and given as an example of a reference wiring pattern indicated by the reference wiring data 310 (FIG. 3) supplied from the wiring system 150. FIG. 7 shows a reference wiring pattern 212 as an alternative to the reference wiring pattern 210. FIG. 8 shows a connection wiring pattern 410 given as an example of a connection wiring pattern indicated by the connection wiring data 510 (FIG. 3) generated by the wiring data generating part 930A. The wiring data generating part 930A is described next by referring to FIGS. 6 to 8.

FIG. 6 shows the enclosing area 710 enclosing the reference chip 620, and the reference wiring pattern 210 which connects four of electrodes 670 and the corresponding electrodes 660 of the semiconductor chip 610. A part of the reference wiring pattern 210 outside the enclosing area 710 is the rat's nest 270 extending from the electrodes 660 of the semiconductor chip 610 to the outer periphery of the enclosing area 710. A part of the reference wiring pattern 210 covering the enclosing area 710 is composed of the reference fan-out lines 220 and leading wiring patterns 230 that are established as actual wiring patterns. The leading wiring patterns 230 are in the form of straight lines leading from the reference fan-out lines 220 and passing through the outer periphery of the reference chip 620 toward the outer periphery of the enclosing area 710. The reference wiring pattern 210 is composed of the reference fan-out lines 220, the leading wiring patterns 230, and the rat's nest 270. The reference wiring data 310 (FIG. 3) indicating the reference wiring pattern 210 is supplied from the wiring system 150 to the wiring data generating part 930A. A part indicated by the rat's nest 270 is not established as an actual wiring pattern. Hence, wiring data contained in the reference wiring data 310 corresponds to wiring data indicating the reference fan-out lines 220 and wiring data indicating the leading wiring patterns 230.

FIG. 7 shows wiring patterns 240 which replace the part corresponding to the rat's nest 270 in FIG. 6 and which are established as actual wiring patterns according to the rat's nest 270. The reference wiring pattern 212 is composed of the reference fan-out lines 220, the leading wiring patterns 230, and the wiring patterns 240. The reference wiring data 310 (FIG. 3) indicating the reference wiring pattern 212 is supplied from the wiring system 150 to the wiring data generating part 930A.

The reference wiring data 310 indicating each of the reference wiring patterns 210 and 212 shown as examples in FIGS. 6 and 7 is supplied to the wiring data generating part 930A. Meanwhile, the enclosing area wiring pattern 460 (FIG. 8) is generated based on the reference fan-out lines 220 as described later. Thus, wiring data indicating at least a wiring pattern being a part of the reference wiring pattern and containing the reference fan-out lines 220 may be supplied as the reference wiring data 310 to the wiring data generating part 930A.

It is more preferable that the reference wiring pattern be a wiring pattern that is actually designed so as to avoid generation of wiring failure such as omission of wiring, as shown in FIG. 7. However, a reference wiring pattern where actual wiring design is not completed except for reference fan-out parts is still applicable, as long as it is a wiring pattern such as the reference wiring pattern of FIG. 6 given the prospects of wiring without failure by the presence of a rat's nest, for example.

In the examples of FIGS. 6 and 7, the enclosing area 710 is established, and a part of the reference wiring pattern 210 or 212 covering the enclosing area 710 is composed of straight lines leading toward the outer periphery of the enclosing area 710 along the reference fan-out lines 220. If a reference wiring pattern is used has reference fan-out lines for a reference chip leading toward the outer periphery of an enclosing area, omission of wiring, to occur in a connection wiring pattern generated for a semiconductor chip actually placed on a substrate, can be controlled easily. Meanwhile, even if a reference wiring pattern which connects the electrodes 670 and the electrodes 660 and which does not include the enclosing area 710 is generated and then used, the utility of the present invention is not damaged.

As shown in FIGS. 6 and 7, if a connection wiring pattern including leading wiring patterns for a semiconductor chip placed on a substrate is established based on reference fan-out lines of a reference wiring pattern with straight lines leading to the outer periphery of an enclosing area, routing of lines in the established connection wiring pattern is not extremely different from that in the reference wiring pattern. Thus, fluctuations in electrical characteristics can be controlled easily.

As shown in FIG. 8, the wiring data generating part 930A generates the enclosing area wiring data 560 indicating the enclosing area wiring pattern 460 and different area wiring data 540 indicating different wiring patterns 440. The wiring data generating part 930A can generate the enclosing area wiring data 560 in various ways.

As an example, the wiring data generating part 930A establishes fan-out lines 420 such that the positions and the angles of reference fan-out lines relative to a reference chip, and the positions and the angles of the fan-out lines 420 for the semiconductor chip 630 on a substrate W relative to the semiconductor chip 630, agree with each other independently of a configuration error of the semiconductor chip 630. Then, the wiring data generating part 930A extends the fan-out lines 420 to the outer periphery of the enclosing area 710, thereby establishing leading wiring patterns 430. The wiring data generating part 930A establishes as the enclosing area wiring pattern 460 a wiring pattern composed of the fan-out lines 420 and the leading wiring patterns 430, and generates the enclosing area wiring data 560 (FIG. 8) indicating the enclosing area wiring pattern 460.

According to different technique, the wiring data generating part 930A regards each of the reference fan-out lines 220 and corresponding one of the leading wiring patterns 230 as an integral line, for example. Then, the wiring data generating part 930A adjusts the position and the angle of the integral line such that the position and the angle of the integral line relative to the reference chip 620, and the position and the angle of the integral line relative to the semiconductor chip 630, agree with each other. The wiring data generating part 930A controls the length of the integral line adjusted in position and angle, thereby establishing the enclosing area wiring pattern 460 composed of the fan-out lines 420 and the leading wiring patterns 430. Then, the wiring data generating part 930A generates the enclosing area wiring data 560 indicating the enclosing area wiring pattern 460.

In both of the aforementioned techniques, the wiring data generating part 930A establishes the enclosing area wiring pattern 460 such that the positions and the angles of the reference fan-out lines 220 relative to the reference chip 620, and the positions and the angles of fan-out lines for the semiconductor chip 630 on a substrate W relative to the semiconductor chip 630, agree with each other independently of a configuration error of the semiconductor chip 630. Then, the wiring data generating part 930A generates the enclosing area wiring data 560 indicating the enclosing area wiring pattern 460.

As described above, based on the reference fan-out lines 220 being a part of a reference wiring pattern established in advance for the reference chip 620 free from a configuration error, the wiring data generating part 930A generates the enclosing area wiring data 560 indicating the enclosing area wiring pattern 460 being a part of the connection wiring pattern 410 and covering a part corresponding to the enclosing area 710. The wiring data generating part 930A generates the enclosing area wiring data 560 in a CAD format such as a GDS format.

Next, the wiring data generating part 930A generates the different area wiring data 540 indicating the different wiring patterns 440 being a part of the connection wiring pattern 410 and except the enclosing area wiring pattern 460. For generation of the different area wiring data 540, the wiring data generating part 930A first specifies the position (coordinate) of each intersection 690 between the enclosing area wiring pattern 460 and the outer periphery of the enclosing area 710.

As an exemplary way to obtain the position of the intersection 690, the wiring data generating part 930A calculates the position of the intersection 690 by using an equation indicating the enclosing area wiring pattern 460 and an equation about a segment representing a part of the outer periphery of the enclosing area 710 where each leading wiring patterns 430 crosses the outer periphery.

In order to calculate the coordinate of the intersection 690 easily, it is preferable that the area information acquiring part 920 acquire the enclosing area information 810 defining a polygonal area as the enclosing area 710. It is also preferable that the wiring data generating part 930A generate the enclosing area wiring data 560 indicating the enclosing area wiring pattern 460 of a shape defined by the fan-out lines 420 linearly leading to the outer periphery of the enclosing area 710. Once both the outer periphery of the enclosing area 710 and the enclosing area wiring pattern 460 are specified, the positions of the intersections 690 can be calculated. Thus, even if the enclosing area 710 is not a polygonal area, or even if the enclosing area wiring pattern 460 is not a linear pattern, the utility of the present invention is not damaged.

Then, the wiring data generating part 930A obtains the wiring patterns 440 which connects the intersections 690 and the corresponding electrodes 660 of the semiconductor chip 610 being destination electrodes of connection based on the net list contained in the design information 44, thereby generating the different area wiring data 540 indicating the wiring patterns 440. The wiring data generating part 930A generates the different area wiring data 540 in a CAD format such as a GDS format.

In establishing the wiring patterns 440, the wiring data generating part 930A can establish the wiring patterns 440 by partially modifying the wiring patterns 240 being a part of the reference wiring pattern 212 shown in FIG. 7, for example. The wiring data generating part 930A may not use the wiring patterns 240 but can establish the wiring patterns 440 newly which connect the intersections 690 and the electrodes 660. In either way, by using publicly known technique based on a net list, the entire wiring patterns 440 can be established or parts of the wiring patterns 440 can be established by modification based on the calculated positions of the intersections 690.

As long as the enclosing area 710 is within a range that is fixed relative to a substrate W independently of a configuration error of the semiconductor chip 630, once the enclosing area 710 is specified, the outer periphery of the enclosing area 710 is not required to be specified repeatedly each time the configuration error is changed. This facilitates process of calculating the positions of the intersections 690. Hence, the area information acquiring part 920 acquires the enclosing area information 810 that defines as the enclosing area 710 an area in a range that is fixed relative to a substrate W independently of a configuration error. Even if the enclosing area 710 is changed in response to a configuration error, the wiring data generating part 930A can still establish the connection wiring pattern 410 by establishing the enclosing area wiring pattern 460 and the wiring patterns 440. Hence, change of the enclosing area 710 in response to a configuration error does not damage the utility of the present invention.

After the enclosing area wiring data 560 and the different area wiring data 540 are generated, the wiring data generating part 930A supplies the enclosing area wiring data 560 and the different area wiring data 540 as wiring data forming the connection wiring data 510 (FIG. 3) to the imaging data generating part 940.

The imaging data generating part 940 generates the imaging data 580 rasterized for the imaging system 100A based on the connection wiring data 510, specifically, the enclosing area wiring data 560 generated by the wiring data generating device 1A. The imaging data 580 should be one imaging data generated by merging the enclosing area wiring data 560 and the different area wiring data 540. Hence, if the enclosing area wiring data 560 and the different area wiring data 540 are in different formats, they should have the same format before the merge. Further, the final format of the imaging data 580 should be a raster format. Hence, if the imaging data generating part 940 receives the enclosing area wiring data 560 and the different area wiring data 540 in a GDS format, for example, it merges the data 560 and the data 540 in a GDS format, and converts resultant wiring data as a result of the merge to data in a raster format, thereby generating the imaging data 580. The imaging data 580 is stored in the storage part 72A. The exposure controller 980 exposes a substrate W based on the imaging data 580.

A-3. Operation of Wiring Data Generating Device

Figure 9:
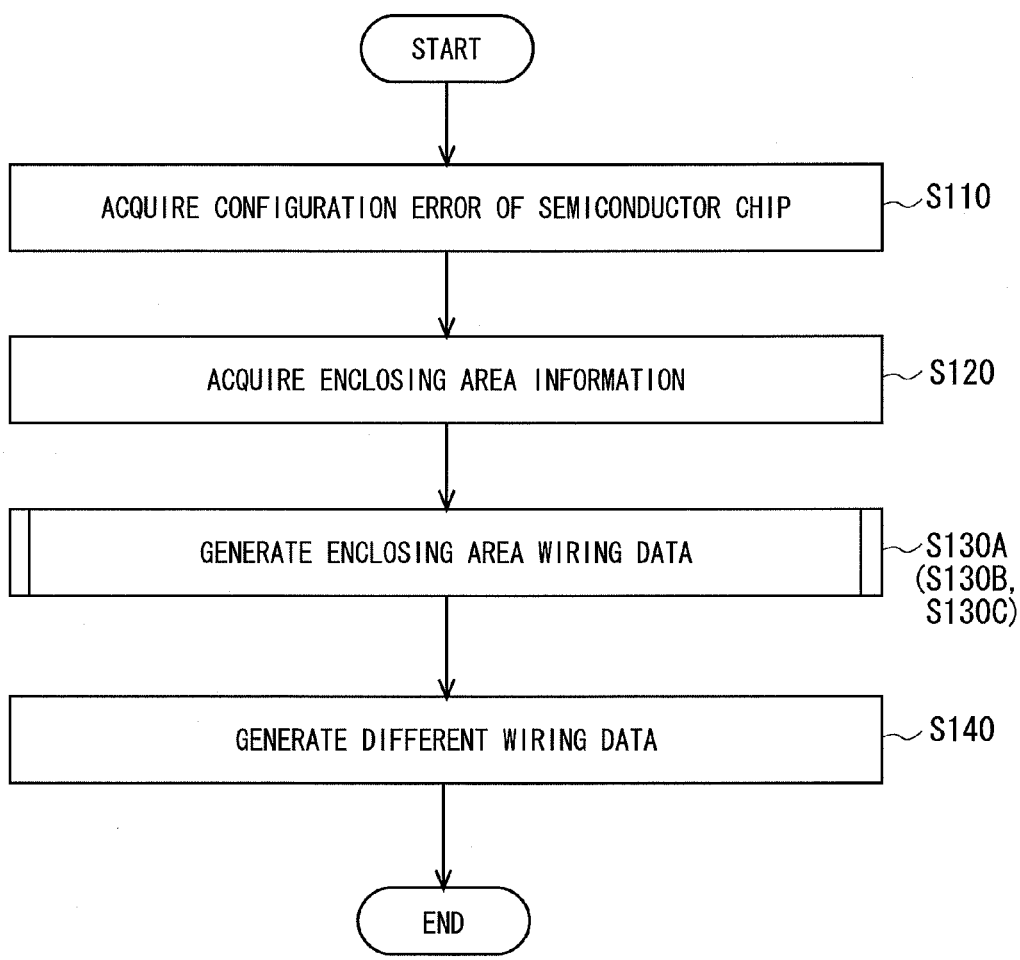
FIG. 9 is a flowchart showing exemplary operations of respective wiring data generating devices of the first and second preferred embodiments.
Figure 10:
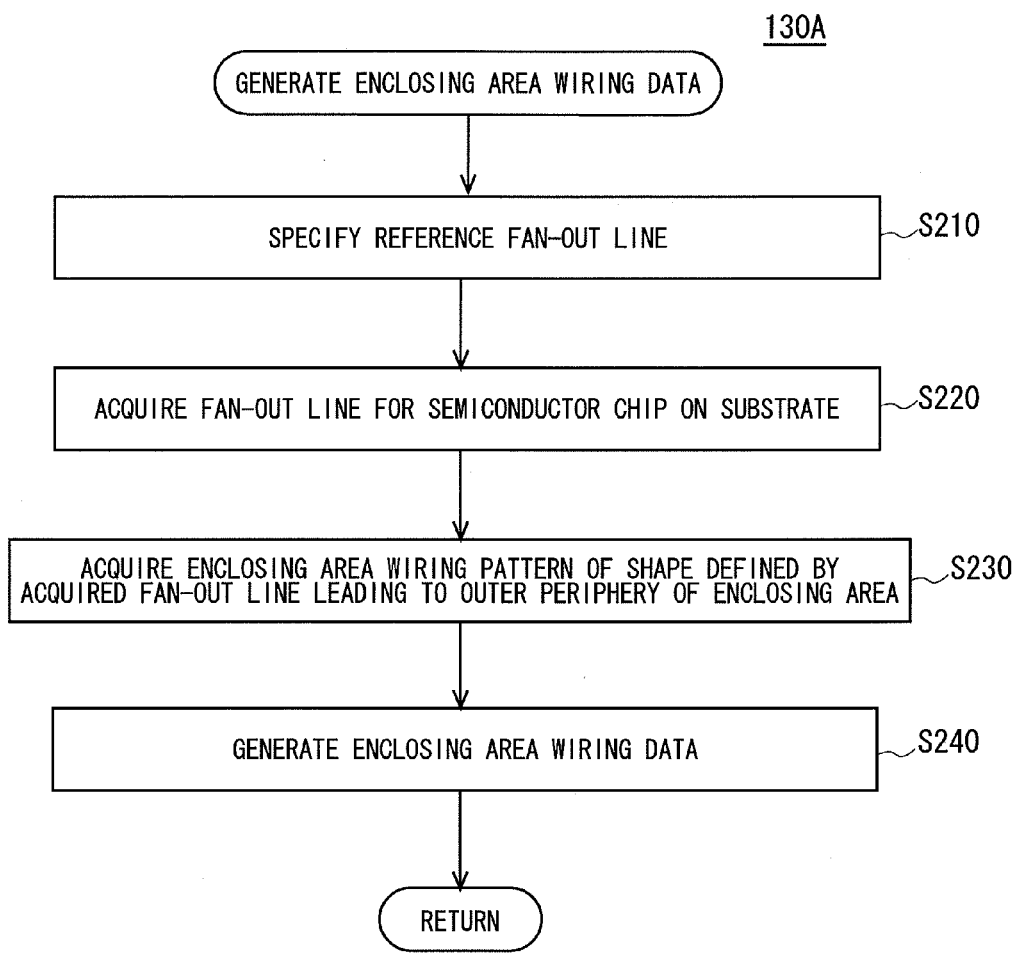
FIG. 10 is a flowchart showing the exemplary operation of the wiring data generating device of the first preferred embodiment.

FIGS. 9 and 10 are flowcharts showing exemplary operation of the wiring data generating device 1A (FIG. 3) of the first preferred embodiment. The flowchart of FIG. 9 also shows exemplary operation of a wiring data generating device 1B of the second preferred embodiment.

Upon receipt of the reference wiring data 310 (FIG. 3) from the wiring system 150 (FIG. 3) and the monitor image 42 (FIG. 3) from the alignment camera 60 (FIG. 3), the wiring data generating device 1A starts process explained in the flowchart of FIG. 9.

First, as shown in FIG. 9, the error acquiring part 910 (FIG. 3) acquires the configuration error 46 (FIG. 3) of the semiconductor chip 630 (FIG. 3) relative to a certain reference position and a certain reference angle on a substrate W (step S110). Then, the area information acquiring part 920 (FIG. 3) acquires the enclosing area information 810 (FIG. 3) indicating the enclosing area 710 (FIG. 8) broader than the area of the semiconductor chip 630 and enclosing the semiconductor chip 630 on the substrate W (Step S120).

Upon receipt of the configuration error 46 and the enclosing area information 810, the wiring data generating part 930A generates the enclosing area wiring data 560 (FIG. 8) (step S130A). When the process in step S130A is started, the flow proceeds to FIG. 10, and the wiring data generating part 930A specifies the reference fan-out lines 220 (FIG. 6 or 7) being a part of a reference wiring pattern indicated by the reference wiring data 310 supplied in advance from the wiring system 150 (step S210).

Next, based on the reference fan-out lines 220, the wiring data generating part 930A acquires the fan-out lines 420 for the semiconductor chip 630 on the substrate W such that the positions and the angles of the reference fan-out lines 220 relative to the reference chip 620 (FIG. 6 or 7), and the positions and the angles of the fan-out lines 420 for the semiconductor chip 630 (FIG. 8) on the substrate W relative to the semiconductor chip 630, agree with each other independently of a configuration error of the semiconductor chip 630 (step S220).

The wiring data generating part 930A acquires the enclosing area wiring pattern 460 (FIG. 8) of a shape defined by the fan-out lines 420 thereby acquired leading to the outer periphery of the enclosing area 710 (step S230), and generates the enclosing area wiring data 560 (FIGS. 3 and 8) indicating the enclosing area wiring pattern 460 (step S240). Then, the process in step S130A is completed.

Next, the flow returns to FIG. 9. Based on the positions of the intersections 690 (FIG. 8) between the enclosing area wiring pattern 460 and the outer periphery of the enclosing area 710, the wiring data generating part 930A generates the different area wiring data 540 (FIGS. 3 and 8) indicating the wiring patterns 440 (FIG. 8) being a part of the connection wiring pattern 410 (FIG. 8) and except the enclosing area wiring pattern 460 (step S140).

Second Preferred Embodiment

B-1. Structure of Imaging System

Like the imaging system 100A of the first preferred embodiment, the imaging system 100B of the second preferred embodiment is a direct imaging system that images a pattern by applying a light beam onto a surface of a substrate W such as a semiconductor substrate and a glass substrate given a photosensitive material on the surface. As shown in FIGS. 1 and 2, the imaging system 100B differs from the imaging system 100A in that it includes the controller 70B. Components of the imaging system 100B except the controller 70B have structures and functions similar to those of corresponding components of the imaging system 100A identified by the same reference numbers. A wiring system 150 as a different system external to the imaging system 100B has a structure and a function similar to those of the wiring system 150 connected to the imaging system 100A. The controller 70B is described below.

Like the controller 70A of the imaging system 100A, the controller 70B is an information processor to control the operation of each component inside the imaging system 100B while executing various arithmetic operations. As an example, the controller 70B is composed of a computer with a CPU 900B (FIG. 11), a storage part 72B (FIG. 11) and the like electrically connected to each other. The controller 70B also includes an exposure controller 980 (FIG. 11) electrically connected to the CPU 900B. The aforementioned computer and the exposure controller 980 are housed in one electrical rack (not shown in the drawings). The controller 70B is electrically connected to the aforementioned components such as the stage moving mechanism 20, the position parameter measuring mechanism 30, the optical head unit 50, and the alignment camera 60. The controller 70B makes the CPU 900B read a program PG2 stored in the storage part 72B and execute the program PG2, thereby controlling the respective operations of these components. Like the controller 70A, the controller 70B is connected through a communication line to the wiring system 150 external to the imaging system 100B.

Like the controller 70A, the controller 70B can detect a configuration error of a semiconductor chip placed on a substrate by detecting the position of an electrode pad of the semiconductor chip.

B-2. Functional Structure of Imaging System

<B-2-1. Overall Functional Structure of Imaging System>

Figure 11:
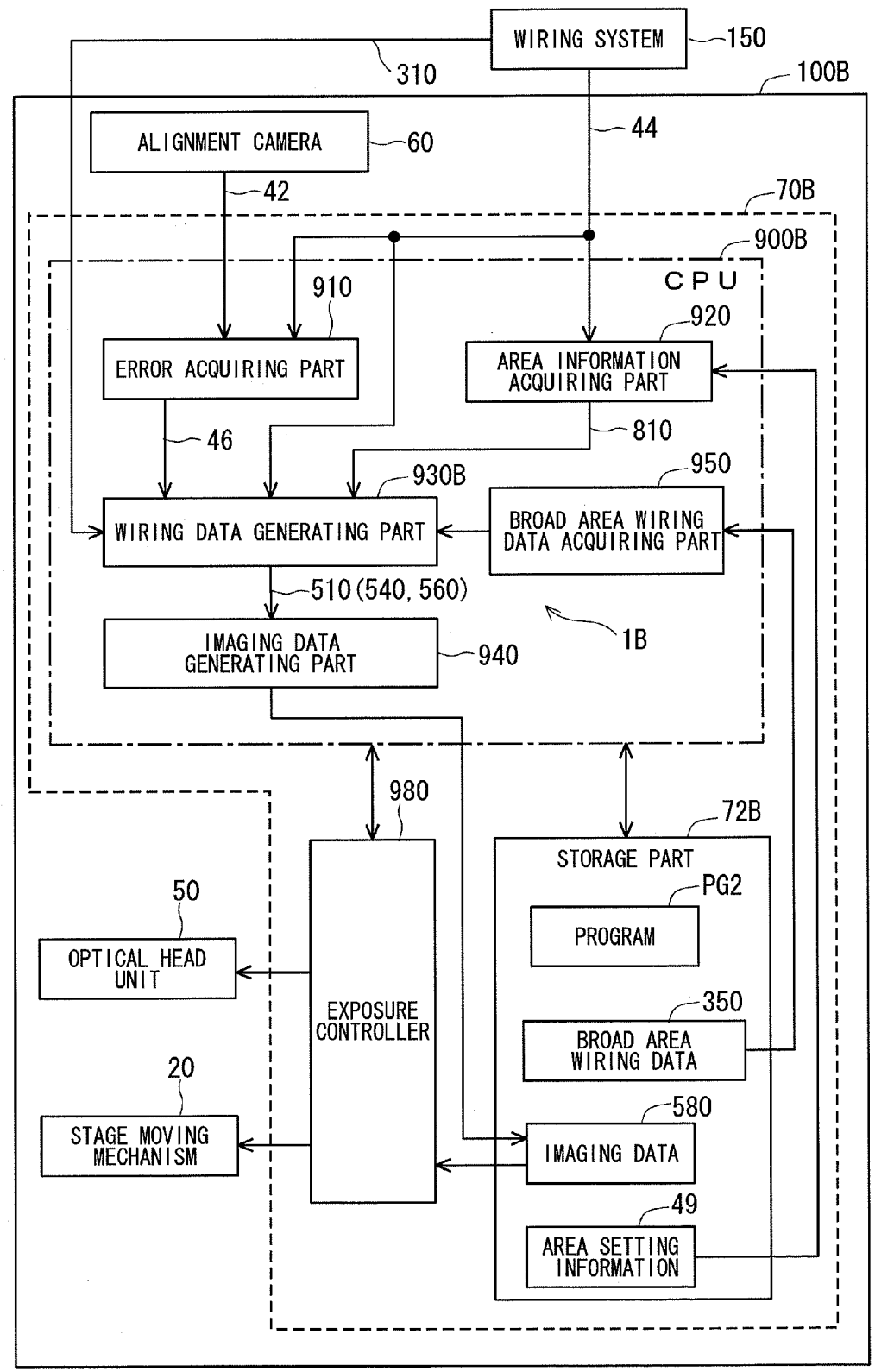
FIG. 11 is a block diagram showing an exemplary functional structure of the imaging system of the second preferred embodiment.

FIG. 11 is a block diagram showing an exemplary functional structure relating to control of imaging operation by the imaging system 100B of the second preferred embodiment. As shown in FIG. 11, the imaging system 100B mainly includes, as functional elements relating to control of the imaging operation, the alignment camera 60, the controller 70B, the optical head unit 50, and the stage moving mechanism 20. The imaging operation is controlled in response to the operations of these elements.

The controller 70B is composed of a computer with the CPU 900B and the storage part 72B such as a memory. The controller 70B includes the exposure controller 980 in addition to the computer. The CPU 900B in the computer performs arithmetic operation according to the program PG2, thereby realizing functions such as an error acquiring part 910, an area information acquiring part 920, a wiring data generating part 930B, an imaging data generating part 940, and a broad area wiring data acquiring part 950.

The error acquiring part 910, the area information acquiring part 920, the wiring data generating part 930B, and the broad area wiring data acquiring part 950 form the wiring data generating device 1B. The wiring data generating device 1B generates connection wiring data 510 (FIG. 11) indicating a connection wiring pattern which electrically connects an electrode of a semiconductor chip on a substrate W and an electrode being a destination electrode of the connection on the substrate W, specifically a destination electrode arranged within an area of the substrate W, based on predetermined connection specified for example in a net list. In other words, the wiring data generating device 1B generates wiring data indicating a connection wiring pattern extending over the substrate W from each electrode of a semiconductor chip on the substrate W.

The controller 70B differs from the controller 70A in that it includes the storage part 72B and the wiring data generating device 1B in the CPU 900B. Components of the controller 70B identified by the same reference numbers as those of the components of the controller 70A have structures and functions similar to those of these components of the controller 70A.

The storage part 72B is composed of a memory such as a ROM and a RAM. Like in the storage part 72A, the program PG2 to be read and executed by the CPU 900B, area setting information 49 and the like are stored in advance in the storage part 72B. Broad area wiring data 350 is also stored in advance in advance in the storage part 72B.

Figure 12:
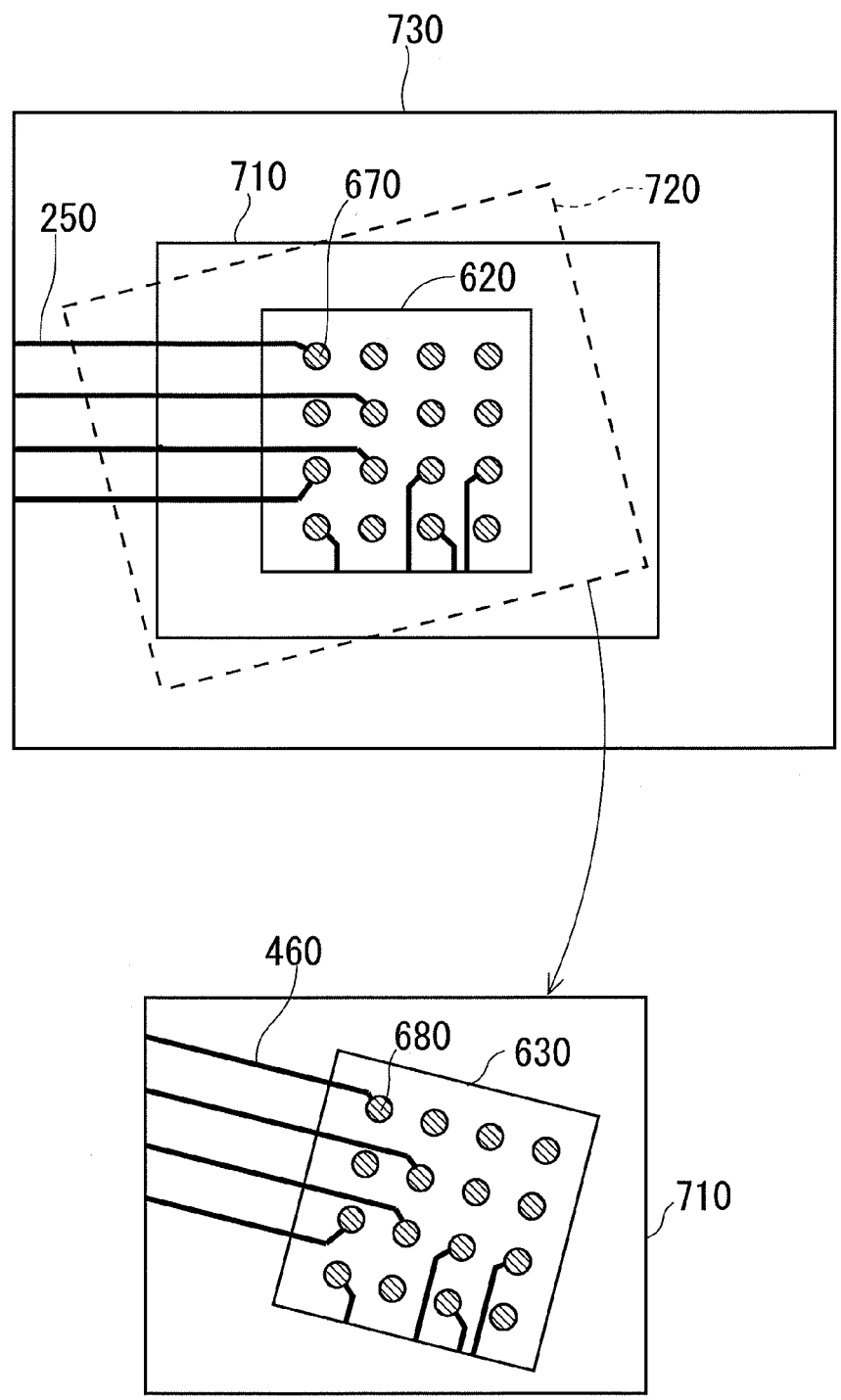
FIG. 12 explains generation of an enclosing area wiring pattern according to first technique.

As shown in FIG. 12, for example, the broad area wiring data 350 is wiring data indicating a broad area wiring pattern 250 of a shape defined by reference fan-out lines for a reference chip 620 leading to the outer periphery of a predetermined broad area 730. The broad area wiring data 350 stored in the storage part 72B can include a plurality of data segments corresponding to different types of reference fan-out lines such as broad area wiring patterns 250 and 252 shown in FIGS. 13 and 14 respectively. For generation of the broad area wiring data 350, the wiring system 150 first generates wiring data in a format such as a GDS format indicating a broad area wiring pattern for a broad area based on the reference angle of a reference chip. Then, the CPU 900B rasterizes the resultant wiring data to conform to the imaging system 100B, thereby generating the broad area wiring data 350 in a raster format.

As described, it is preferable that the broad area wiring data 350 be generated in advance in a raster format in terms of shortening of process time. However, even if the broad area wiring data 350 is generated in a CAD format such as a GDS format, the wiring data generating device 1B can still generate the connection wiring data 510 based on the broad area wiring data 350. Thus, the utility of the present invention is not damaged in this case.

<B-2-2. Functional Structure of Wiring Data Generating Device>

The wiring data generating device 1B is composed of the error acquiring part 910, the area information acquiring part 920, the wiring data generating part 930B, and the broad area wiring data acquiring part 950. A substantial difference between the wiring data generating devices 1A and 1B lies in that the wiring data generating device 1B includes the wiring data generating part 930B and the broad area wiring data acquiring part 950.

Components of the wiring data generating device 1B except the wiring data generating part 930B and the broad area wiring data acquiring part 950 have structures and functions similar to those of corresponding components of the wiring data generating device 1A identified by the same reference numbers.

More specifically, as shown in FIG. 11, the error acquiring part 910 acquires a configuration error 46 and supplies the configuration error 46 to the wiring data generating part 930B. The area information acquiring part 920 acquires enclosing area information 810 indicating the position, the size, the shape and the like of an enclosing area 710, and supplies the enclosing area information 810 to the wiring data generating part 930B. The area setting information 49 used by the area information acquiring part 920 may be the predetermined enclosing area information 810 itself. In this case, the area information acquiring part 920 may retrieve the enclosing area information 810 from the storage part 72B, and supply the retrieved enclosing area information 810 as it is to the wiring data generating part 930B.

The broad area wiring data acquiring part 950 retrieves the broad area wiring data 350 indicating the aforementioned broad area wiring pattern from the storage part 72B, and supplies the broad area wiring data 350 to the wiring data generating part 930B.

Based on the configuration error 46, the enclosing area information 810, a net list contained in design information 44, the broad area wiring data 350 and the like, the wiring data generating part 930B can establish an enclosing area wiring pattern according to two techniques including first technique and second technique described next, and then generate enclosing area wiring data indicating the resultant enclosing area wiring pattern.

<B-2-2-1. First Technique of Generating Enclosing Area Wiring Pattern by Wiring Data Generating Part>

FIG. 12 explains generation of an enclosing area wiring pattern according to the first technique. As shown in the upper part of FIG. 12, the enclosing area 710 encloses the reference chip 620 placed in a certain reference position and a certain reference angle on a substrate W. The broad area 730 is a predetermined area broader than the enclosing area 710 and enclosing the enclosing area 710. The broad area wiring pattern 250 has a shape defined by fan-out lines established for corresponding electrodes 670 of the reference chip 620 and leading to the outer periphery of the broad area 730. The broad area wiring pattern 250 is a wiring pattern indicated by the broad area wiring data 350 stored in the storage part 72B. The broad area wiring data 350 is retrieved by the broad area wiring data acquiring part 950, and then supplied to the wiring data generating part 930B. The broad area wiring pattern 250 is changed in response to the positions and the angles of electrodes 660 being destination electrodes of connection and the reference chip 620 relative to each other.

A corresponding area 720 is an area which is specified in the broad area 730 relative to the reference chip 620, and which corresponds to the enclosing area 710 enclosing a semiconductor chip 630 shown in the lower part of FIG. 12. The corresponding area 720 is specified by the wiring data generating part 930B.

The wiring data generating part 930B specifies as the enclosing area wiring pattern 460 a wiring pattern being a part of the broad area wiring pattern 250 and covering the specified corresponding area 720, and generates enclosing area wiring data 560 (FIG. 11) indicating the enclosing area wiring pattern 460. Thus, in the first technique, the wiring data generating part 930B establishes the enclosing area wiring pattern 460 such that the positions and the angles of the reference fan-out lines relative to the reference chip 620, and the positions and the angles of fan-out lines relative to the semiconductor chip 630 on a substrate W relative to the semiconductor chip 630, agree with each other independently of a configuration error of the semiconductor chip 630.

<B-2-2-2. Second Technique of Generating Enclosing Area Wiring Pattern by Wiring Data Generating Part>

Figure 13:
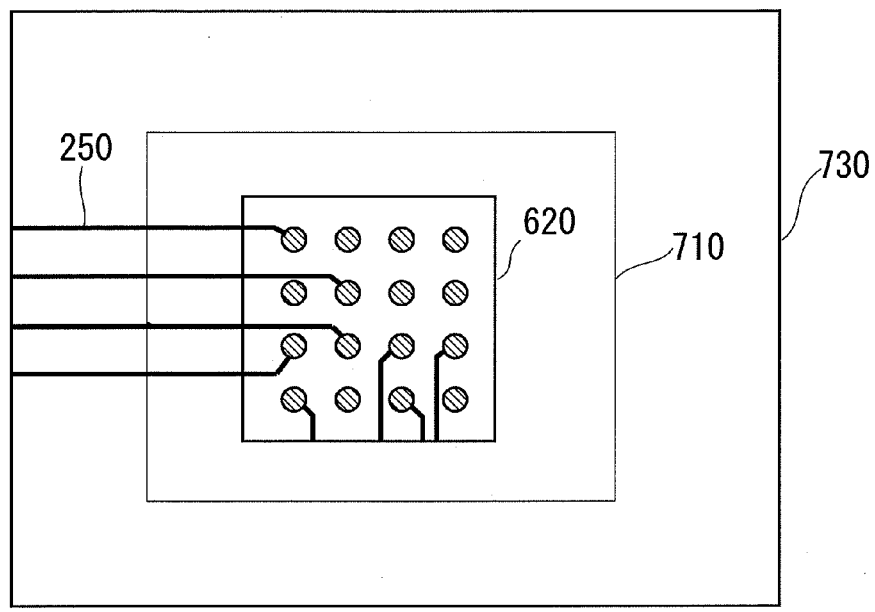
FIGS. 13 and 14 each show an exemplary broad area wiring pattern used in second technique.
Figure 14:
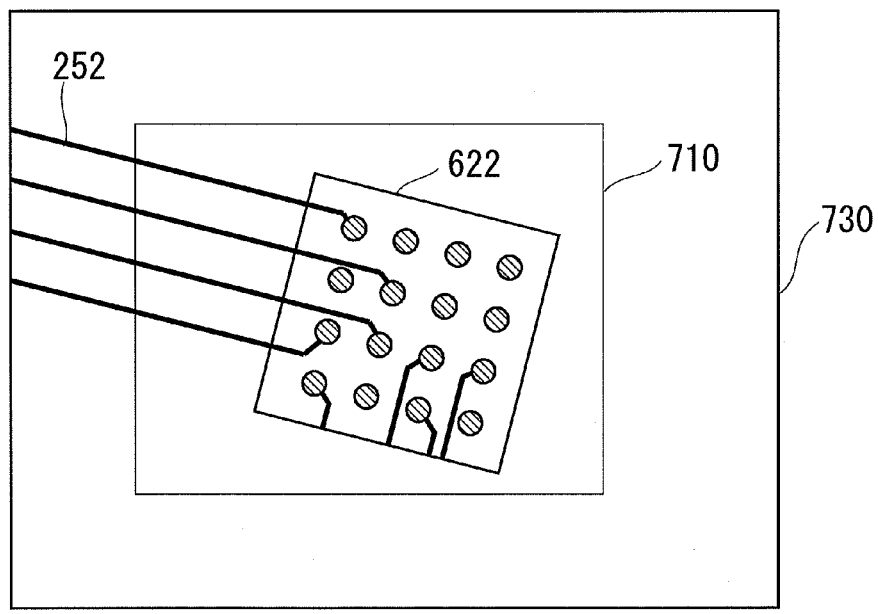
Figure 15:
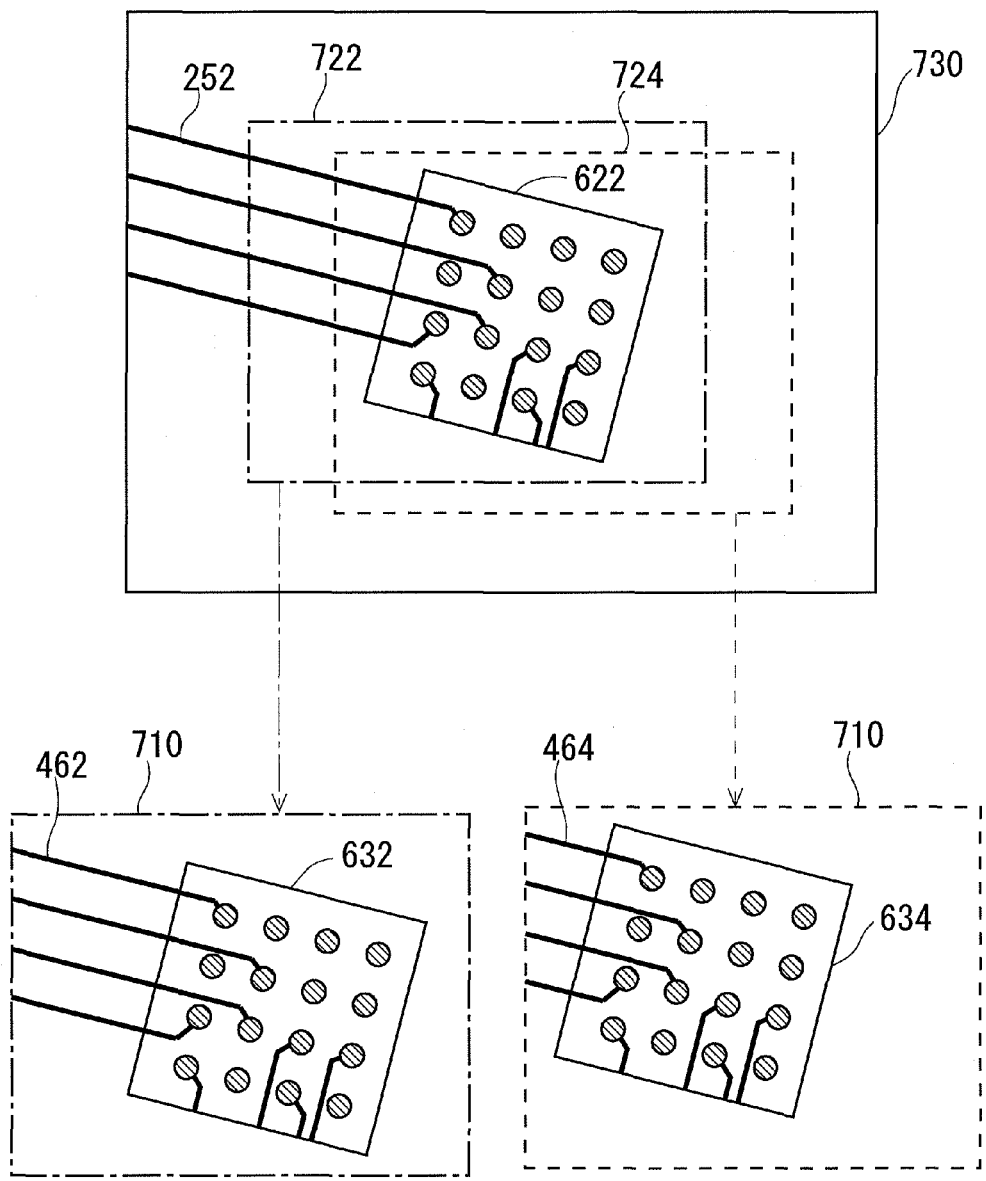
FIG. 15 explains generation of an enclosing area wiring pattern according to the second technique.

FIGS. 13 and 14 show the broad area wiring patterns 250 and 252 respectively different from each other that are given as examples of a plurality of broad area wiring data segments 350 used in the second technique. FIG. 15 explains generation of an enclosing area wiring pattern according to the second technique.

As shown in FIGS. 13 and 14, regarding respective reference positions and reference angles of the reference chip 620 and a reference chip 622, the reference chips 620 and 622 different from each other at least in reference angle. FIG. 13 shows part within a range of the broad area 730 shown in the upper part of FIG. 12. The broad area wiring pattern 252 of FIG. 14 is established for the reference chip 622 in the same manner as the broad area wiring pattern 250. The storage part 72B stores a plurality of broad area wiring data segments 350 (FIG. 11) indicating the broad area wiring patterns 250 and 252. The broad area wiring data segments 350 are retrieved from the storage part 72B by the broad area wiring data acquiring part 950, and then supplied to the wiring data generating part 930B.

The broad area wiring patterns 250 and 252 may be established based on reference wiring patterns designed independently for the reference chips 620 and 622 respectively by the wiring system 150 according to net lists. Alternatively, the broad area wiring pattern 250 may be established based on a reference wiring pattern designed by the wiring system 150. Then, the broad area wiring pattern 252 may be established by adjusting the position and the angle of the resultant broad area wiring pattern 250 based on a difference between the position and the angle of the reference chip 620 and the position and the angle of the reference chip 622 relative to each other, for example. In this case, lengths of the patterns are adjusted, where appropriate. As described, if a broad area wiring pattern is established based on a different broad area wiring pattern without involving design based on a net list, time required for retrieving the broad area wiring data segments 350 is reduced.

First, the wiring data generating part 930B selects a reference angle most similar to the angle of a semiconductor chip placed on a substrate W from a plurality of reference angles of the reference chips 620 and 622 relating to the broad area wiring patterns 250 and 252 respectively. The upper part of FIG. 15 shows the reference angle of the reference chip 622 selected from the reference angles of the semiconductor chips 620 and 622 as an angle most similar to the angle of a semiconductor chip placed on a substrate W.

Next, the wiring data generating part 930B selects wiring data corresponding to the selected reference angle from the broad area wiring data segments 350 supplied to the wiring data generating part 930B. After selecting the broad area wiring data 350 to be used, the wiring data generating part 930B applies the first technique by using the selected broad area wiring data 350 to generate the enclosing area wiring data 560 (FIG. 11). Thus, in the second technique, the wiring data generating part 930B also establishes an enclosing area wiring pattern such that the positions and the angles of reference fan-out lines relative to a reference chip, and the positions and the angles of fan-out lines for a semiconductor chip on a substrate W relative to the semiconductor chip, agree with each other independently of a configuration error of the semiconductor chip.

The lower part of FIG. 15 shows a semiconductor chip 632 and a semiconductor chip 634 placed on a substrate W. The semiconductor chips 632 and 634 are in the same reference angle but in different reference positions. As an example, regarding establishment of an enclosing area wiring pattern 462 for the semiconductor chip 632, the wiring data generating part 930B establishes as the enclosing area wiring pattern 462 a wiring pattern being a part of the broad area wiring pattern 252 and covering a corresponding area 722. Then, the wiring data generating part 930B generates the enclosing area wiring data 560 indicating the enclosing area wiring pattern 462. Likewise, regarding establishment of an enclosing area wiring pattern 464 for the semiconductor chip 634, the wiring data generating part 930B establishes as the enclosing area wiring pattern 464 a wiring pattern being a part of the broad area wiring pattern 252 and covering a corresponding area 724. Then, the wiring data generating part 930B generates the enclosing area wiring data 560 indicating the enclosing area wiring pattern 464.

It is preferable that the broad area wiring data 350 be generated in advance in a raster format in terms of shortening of process time. More specifically, if the broad area wiring data 350 is wiring data in a raster format, the resultant enclosing area wiring data 560 is in a raster format from the first. In contrast, if the broad area wiring data 350 is in a CAD format such as a GDS format and the enclosing area wiring data 560 is generated in the same format based on the broad area wiring data 350, the enclosing area wiring data 560 is converted to a raster format. Thus, generating the enclosing area wiring data 560 in a raster format from the first shortens process time as it does not require time for this conversion. However, even if the broad area wiring data 350 is generated in a CAD format such as a GDS format, the wiring data generating device 1B can still generate the connection wiring data 510 based on the broad area wiring data 350. Thus, the utility of the present invention is not damaged in this case.

After generating the enclosing area wiring data 560 (FIG. 11) according to the first or second technique, the wiring data generating part 930B generates different area wiring data 540 (FIG. 11) indicating a different wiring pattern being a part of the connection wiring pattern 410 and except an enclosing area wiring pattern indicated by the enclosing area wiring data 560. Like the different area wiring data generated by the wiring data generating part 930A described by referring to FIG. 8, the different area wiring data 540 is generated based on the position (coordinate) of each intersection between the enclosing area wiring pattern and the outer periphery of the enclosing area 710. The different area wiring data 540 is generally generated in a CAD format such as a GDS format.

For the same reason as set forth about establishment of an enclosing area wiring pattern by the wiring data generating part 930A, in establishing an enclosing area wiring pattern according to first or second technique, it is preferable that the area information acquiring part 920 acquire the enclosing area information 810 defining a polygonal area as the enclosing area 710.

Further, it is preferable that the wiring data generating part 930B generate the enclosing area wiring data 560 indicating an enclosing area wiring pattern of a shape defined by fan-out lines for a semiconductor chip on a substrate W linearly leading to the outer periphery of the enclosing area 710.

Additionally, it is preferable that the area information acquiring part 920 acquire the enclosing area information 810 defining as the enclosing area 710 an area within a range that is fixed relative to a substrate W independently of a configuration error of a semiconductor chip.

After generating the enclosing area wiring data 560 and the different area wiring data 540, the wiring data generating part 930B supplies as wiring data forming the connection wiring data 510 (FIG. 11) the enclosing area wiring data 560 and the different area wiring data 540 to the imaging data generating part 940.

The imaging data generating part 940 generates imaging data 580 (FIG. 11) rasterized for the imaging system 100B based on the connection wiring data 510, specifically, the enclosing area wiring data 560 generated by the wiring data generating device 1B. The imaging data 580 should be one imaging data generated by merging the enclosing area wiring data 560 and the different area wiring data 540. Hence, if the enclosing area wiring data 560 and the different area wiring data 540 are in different formats, they should have the same format before the merge. Further, the final format of the imaging data 580 should be a raster format. Hence, if the imaging data generating part 940 receives the enclosing area wiring data 560 in a raster format and the different area wiring data 540 in a GDS format, for example, it converts the different area wiring data 540 first to a raster format. Then, the imaging data generating part 940 merges the enclosing area wiring data 560 and the different area wiring data 540 both in a raster format to generate the imaging data 580. The imaging data 580 is stored in the storage part 72B. The exposure controller 980 exposes a substrate W based on the imaging data 580.

B-3. Operation of Wiring Data Generating Device

Figure 16:
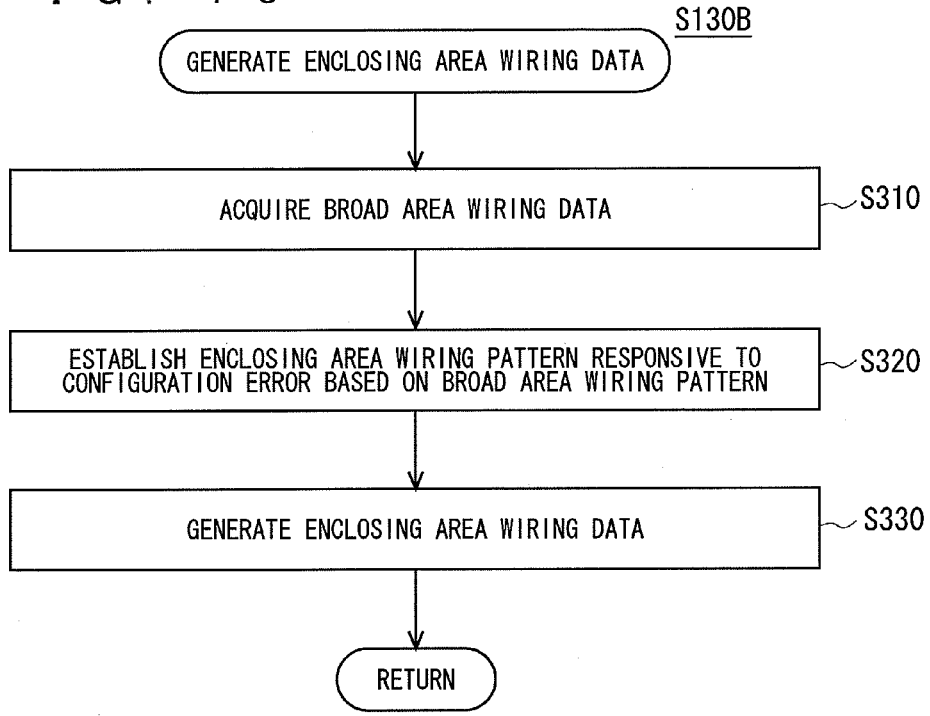
FIGS. 16 and 17 are flowcharts showing the exemplary operation of the wiring data generating device of the second preferred embodiment.
Figure 17:
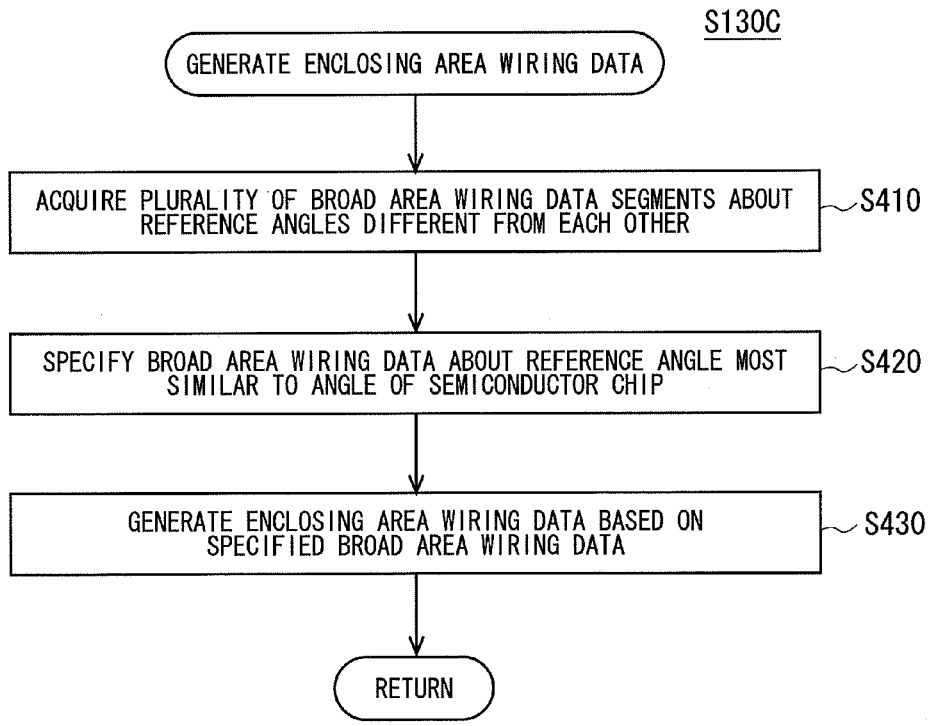

FIGS. 16 and 17 are flowcharts showing exemplary operation of the wiring data generating device 1B of the second preferred embodiment. The flowchart of FIG. 16 corresponds to the aforementioned first technique of generating an enclosing area wiring pattern, and shows in detail the process in step S130B of the flowchart of FIG. 9. The flowchart of FIG. 17 corresponds to the aforementioned second technique of generating an enclosing area wiring pattern, and shows in detail the process in step S130B of the flowchart of FIG. 9. Here, the aforementioned flowchart of FIG. 9 is not described again. Generation of enclosing area wiring data according to the first technique of generating an enclosing area wiring pattern is described based on the flowchart of FIG. 16 by referring to FIGS. 11 and 12, where appropriate. Further, generation of enclosing area wiring data according to the second technique of generating an enclosing area wiring pattern is described based on the flowchart of FIG. 17 by referring to FIGS. 11 and 13 to 15, where appropriate.

<B-3-1. Operation of Generating Enclosing Area Wiring Data According to First Technique>

When the process in step S130B of the flowchart of FIG. 9 is started, the flow proceeds to FIG. 16. The broad area wiring data acquiring part 950 retrieves the broad area wiring data 350 from the storage part 72B (step S310), and supplies the broad area wiring data 350 to the wiring data generating part 930B as shown in FIG. 11.

Next, as shown in FIG. 12, the wiring data generating part 930B establishes the enclosing area wiring pattern 460 responsive to a configuration error of the semiconductor chip 630 on a substrate W based on the broad area wiring pattern 250 indicated by the broad area wiring data 350 (step S320). More specifically, a wiring pattern covering the corresponding area 720 (FIG. 12) and responsive to the configuration error of the semiconductor chip 630 is extracted from the broad area wiring pattern 250. Then, the position and the angle of the extracted wiring pattern are adjusted in response to the configuration error so as to be adaptable to the position and the angle of the enclosing area 710 for the semiconductor chip 630, thereby establishing the extracted wiring pattern as the enclosing area wiring pattern 460.

The wiring data generating part 930B generates the enclosing area wiring data 560 (FIG. 11) indicating the enclosing area wiring pattern 460 thereby established (step S330). Then, the process in the flowchart of FIG. 16 is completed, and the flow returns to step S140 (FIG. 9).

<B-3-2. Operation of Generating Enclosing Area Wiring Data According to Second Technique>

When the process in step S130B of the flowchart of FIG. 9 is started, the flow proceeds to FIG. 17. The broad area wiring data acquiring part 950 (FIG. 11) retrieves the broad area wiring data segments 350 about different reference angles from the storage part 72B (FIG. 11) (step S410), and supplies the broad area wiring data segments 350 to the wiring data generating part 930B as shown in FIG. 11. In other words, the broad area wiring data acquiring part 950 acquires a plurality of broad area wiring data candidates about corresponding reference angle candidates different from each other. Specifically, the broad area wiring data segments 350 acquired here indicate the broad area wiring patterns 250 and 252 shown in FIGS. 13 and 14 respectively.

Next, the wiring data generating part 930B specifies broad area wiring data 350 about a reference angle most similar to the angle of the semiconductor chip 630 (step S420). More specifically, the wiring data generating part 930B first selects a reference angle most similar to the angle of a semiconductor chip placed on a substrate W from a plurality of reference angles corresponding to respective broad area wiring data segments 350. Then, the wiring data generating part 930B specifies broad area wiring data 350 about the selected reference angle. In other words, the wiring data generating part 930B selects a reference angle most similar to the actual angle of the semiconductor chip 630 on the substrate W from a plurality of reference angle candidates. Then, the wiring data generating part 930B selects, as the broad area wiring data 350, data about the selected reference angle from the broad area wiring data candidates retrieved by the broad area wiring data acquiring part 950. In the example of FIG. 15, the broad area wiring data 350 indicating the broad area wiring pattern 252 of FIG. 14 is selected.

After selecting the broad area wiring data 350, the wiring data generating part 930B generates the enclosing area wiring data 560 (FIG. 11) based on the selected broad area wiring data 350 (step S430). The enclosing area wiring data 560 is generated in step S430 in the same way as the processes in steps S320 and S330, for example. Then, the process in the flowchart of FIG. 17 is completed, and the flow returns to step S140 (FIG. 9).

According to both the aforementioned wiring data generating devices of the first and second preferred embodiments, an enclosing area wiring pattern being a part of a connection wiring pattern is generated based on reference fan-out lines being a part of a reference wiring pattern free from faulty wiring, specifically a reference wiring pattern having no faulty wiring, and in response to a configuration error of a semiconductor chip relative to a reference position and a reference angle. This controls generation of omission of wiring in an enclosing area including fan-out lines and presenting a high degree of difficulty in wiring, while shortening process time required for generating wiring data. Further, an enclosing area broader than the area of a semiconductor chip makes it possible to shorten and simplify a wiring pattern except the enclosing area wiring pattern, compared to the case where the enclosing area has the same size as the semiconductor chip. This also allows the wiring pattern except the enclosing area wiring pattern to be controlled in terms of generation of omission of wiring, and to be generated in shorter time. Thus, even if electrodes of a semiconductor chip are arranged in a complex manner and the semiconductor chip has a configuration error in terms of its position and its angle, wiring data indicating a connection wiring pattern can be generated while generation of omission wiring is controlled and process time is shortened.

According to the aforementioned wiring data generating device of the second preferred embodiment, while a broad area wiring pattern is established in advance for a predetermined broad area enclosing an enclosing area and broader than the enclosing area so as to have a shape defined by reference fan-out lines leading to the outer periphery of the broad area, a part corresponding to the enclosing area enclosing a semiconductor chip on a substrate is specified in the broad area relative to a reference chip. Then, a wiring pattern being a part of the broad area wiring pattern and covering the specified part is established as an enclosing area wiring pattern, and enclosing area wiring data is generated. Thus, time required for generating the enclosing area wiring data is reduced.

Further, according to the aforementioned wiring data generating device of the second preferred embodiment, a plurality of broad area wiring data segments are acquired that are generated in advance for respective reference angles different from each other, and a reference angle most similar to the angle of a semiconductor chip on a substrate is selected from these reference angles. In other words, a plurality of broad area wiring data candidates about corresponding reference angle candidates different from each other is acquired, and an angle most similar to the actual angle of the semiconductor chip 630 on a substrate W is selected as a reference angle from the reference angle candidates. Then, broad area wiring data about the selected reference angle is selected from the broad area wiring data segments, and enclosing area wiring data is generated based on the selected broad area wiring data. In other words, wiring data about the selected reference angle is selected as the broad area wiring data 350 from a plurality of broad area wiring data candidates, and enclosing area wiring data is generated based on the selected broad area wiring data. Thus, of process of making rotation and process of making translational movement, only the process of making translational movement easier than the other is required to generate enclosing area wiring data based on broad area wiring data. This allows shortening of process time.

Additionally, according to the aforementioned wiring data generating device of the second preferred embodiment, broad area wiring data stored in advance in a storage part is in a raster format as a result of certain rasterizing process performed for an imaging system, for example. Thus, enclosing area wiring data to be generated based on the broad area wiring data is also in a raster format. This eliminates the need of rasterizing process on the enclosing area wiring data during generation of imaging data, thereby shortening process time.

The present invention described in detailed above is in all aspects illustrative and not restrictive. Hence, the preferred embodiments of the present invention can be combined freely, or each of the preferred embodiments can be modified or omitted without departing from the scope of the invention, if appropriate. As an example, while the wiring data generating devices of the first and second preferred embodiments are arranged in the corresponding imaging systems, they may also be provided as devices independent of and external to the imaging systems. Further, electrodes provided around the semiconductor chip 630 may take the place of the electrodes 660 of the semiconductor chip 610 shown for example in FIG. 7 to become electrodes to be connected to the electrodes 670 of the semiconductor chip 620. Additionally, the present invention is applicable to the case where the semiconductor chip 610 movers in the same manner as the reference chip 620, and to the case where only the electrodes 660 are provided without the semiconductor chip 610. Further, while a support base such as a substrate is removed by thinning after electrodes of a semiconductor chip are bonded to the support base and then the semiconductor chip is sealed, the technique of the present invention may be applied to generate a connection wiring pattern on the rear surface of the support base where the electrodes of the semiconductor chip are exposed. Still further, the size of an enclosing area or a broad area may be changed appropriately in response to the size of each semiconductor chip or a distance between semiconductor chips. Additionally, DRC (design rule check) may be made when a wiring data generating device obtains connection wiring data, for example. In this case, process such as downstream generation process may be performed if a result of the check satisfies a certain criterion.

While the invention has been shown and described in detail, the foregoing description is in all aspects illustrative and not restrictive. It is therefore understood that numerous modifications and variations can be devised without departing from the scope of the invention.

What is claimed is:

1. A device for generating wiring data indicating a connection wiring pattern extending over a substrate from each electrode of a semiconductor chip placed on said substrate, the device comprising:
   an error acquiring part that acquires a configuration error of said semiconductor chip relative to a certain reference position and a certain reference angle on said substrate;
   an area information acquiring part that acquires enclosing area information indicating an enclosing area enclosing said semiconductor chip on said substrate; and
   a wiring data generating part that generates enclosing area wiring data indicating an enclosing area wiring pattern based on a reference fan-out line established for a reference chip, the enclosing area wiring pattern being a part of said connection wiring pattern and covering said enclosing area, wherein
   said reference chip expresses the condition of said semiconductor chip placed in said reference position and said reference angle on said substrate,
   a reference wiring pattern free from faulty wiring is assigned to said reference chip as a pattern corresponding to said connection wiring pattern,
   said reference fan-out line is a part of said reference wiring pattern and routed on said reference chip, and
   said wiring data generating part generates said enclosing area wiring data such that the position and the angle of said reference fan-out line relative to said reference chip, and the position and the angle of a fan-out line for said semiconductor chip on said substrate relative to this semiconductor chip, agree with each other independently of said configuration error.

2. The device according to claim 1, further comprising a broad area wiring data acquiring part that acquires broad area wiring data indicating a broad area wiring pattern of a shape defined by said reference fan-out line leading to the outer periphery of a broad area enclosing said enclosing area,
   wherein said wiring data generating part specifies in said broad area a part corresponding to said enclosing area enclosing said semiconductor chip relative to said reference chip, and specifies as said enclosing area wiring pattern a wiring pattern being a part of said broad area wiring pattern and covering the specified part, thereby generating said enclosing area wiring data.

3. The device according to claim 2, wherein
   said broad area wiring data acquiring part acquires a plurality of broad area wiring data candidates about corresponding reference angle candidates different from each other, and
   said wiring data generating part selects as said reference angle an angle most similar to the actual angle of said semiconductor chip on said substrate from said reference angle candidates, and selects as said broad area wiring data a broad area wiring data candidate about said reference angle from said broad area wiring data candidates.

4. The device according to claim 2, wherein said broad area wiring data is in a raster format formed as a result of certain rasterizing process.

5. The device according to claim 1, wherein said enclosing area is in a range that is fixed relative to said substrate independently of said configuration error.

6. The device according to claim 1, wherein said enclosing area is a polygonal area.

7. The device according to claim 1, wherein said wiring data generating part generates said enclosing area wiring data indicating said enclosing area wiring pattern of a shape defined by said fan-out line for said semiconductor chip linearly leading to the outer periphery of said enclosing area.

8. The device according to claim 1, wherein said wiring data generating part further generates different area wiring data indicating a different wiring pattern being a part of said connection wiring pattern and except said enclosing area wiring pattern based on the position of each intersection between said enclosing area wiring pattern and the outer periphery of said enclosing area.

9. An imaging system that directly exposes a substrate placed on a stage, the imaging system comprising:
   a device for generating wiring data indicating a connection wiring pattern extending over a substrate from each electrode of a semiconductor chip placed on said substrate;
   an optical head unit that directly exposes said substrate without using a mask for exposure;
   a stage that holds said substrate thereon, and moves relative to said optical head unit;

a photographing part that photographs said semiconductor chip placed on said substrate; and an imaging data generating part that generates imaging data rasterized for the imaging system, wherein said device includes:

an error acquiring part that acquires a configuration error of said semiconductor chip relative to a certain reference position and a certain reference angle on said substrate;

an area information acquiring part that acquires enclosing area information indicating an enclosing area enclosing said semiconductor chip on said substrate; and a wiring data generating part that generates enclosing area wiring data indicating an enclosing area wiring pattern based on a reference fan-out line established for a reference chip, the enclosing area wiring pattern being a part of said connection wiring pattern and covering said enclosing area, said reference chip expresses the condition of said semiconductor chip placed in said reference position and said reference angle on said substrate, a reference wiring pattern free from faulty wiring is assigned to said reference chip as a pattern corresponding to said connection wiring pattern, said reference fan-out line is a part of said reference wiring pattern and routed on said reference chip, said wiring data generating part generates said enclosing area wiring data such that the position and the angle of said reference fan-out line relative to said reference chip, and the position and the angle of a fan-out line for said semiconductor chip on said substrate relative to this semiconductor chip, agree with each other independently of said configuration error, in said device, said error acquiring part acquires said configuration error based on an image of said semiconductor chip formed by said photographing part, and said wiring data generating part generates said enclosing area wiring data based on said configuration error, said imaging data generating part generates said imaging data based on said enclosing area wiring data generated by said device, and said imaging system makes said optical head unit directly expose said substrate placed on said stage based on said imaging data generated by said imaging data generating part.

10. A method of generating wiring data indicating a connection wiring pattern extending over a substrate from each electrode of a semiconductor chip placed on said substrate, the method comprising the steps of:

(a) acquiring a configuration error of said semiconductor chip relative to a certain reference position and a certain reference angle on said substrate;

(b) acquiring enclosing area information indicating an enclosing area enclosing said semiconductor chip on said substrate; and (c) generating enclosing area wiring data indicating an enclosing area wiring pattern based on a reference fan-out line established for a reference chip, the enclosing area wiring pattern being a part of said connection wiring pattern and covering said enclosing area, wherein said reference chip expresses the condition of said semiconductor chip placed in said reference position and said reference angle on said substrate, a reference wiring pattern free from faulty wiring is assigned to said reference chip as a pattern corresponding to said connection wiring pattern, said reference fan-out line is a part of said reference wiring pattern and routed on said reference chip, and in said step (c), said enclosing area wiring data is generated such that the position and the angle of said reference fan-out line relative to said reference chip, and the position and the angle of a fan-out line for said semiconductor chip on said substrate relative to this semiconductor chip, agree with each other independently of said configuration error.

* * * * *

UNITED STATES PATENT AND TRADEMARK OFFICE
CERTIFICATE OF CORRECTION

| | |
|---|---|
| PATENT NO. | : 8,645,891 B2 |
| APPLICATION NO. | : 13/835398 |
| DATED | : February 4, 2014 |
| INVENTOR(S) | : Kiyoshi Kitamura and Kazuhiro Nakai |

It is certified that error appears in the above-identified patent and that said Letters Patent is hereby corrected as shown below:

Title Page: insert Item (30)

--(30)    Foreign Application Priority Data

June 28, 2012    (JP) ................................ 2012-145880--

Signed and Sealed this
Thirteenth Day of May, 2014

Michelle K. Lee
*Deputy Director of the United States Patent and Trademark Office*